(12) United States Patent
Miyaki et al.

(10) Patent No.: US 7,335,529 B2
(45) Date of Patent: Feb. 26, 2008

(54) MANUFACTURING METHOD OF A SEMICONDUCTOR DEVICE UTILIZING A FLEXIBLE ADHESIVE TAPE

(75) Inventors: Yoshinori Miyaki, Musashimurayama (JP); Yoshihiko Shimanuki, Nanyo (JP); Hiromichi Suzuki, Katsushika (JP); Fujio Ito, Hanno (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/510,679

(22) PCT Filed: Apr. 7, 2003

(86) PCT No.: PCT/JP03/04394

§ 371 (c)(1),
(2), (4) Date: Oct. 8, 2004

(87) PCT Pub. No.: WO03/085726

PCT Pub. Date: Oct. 16, 2003

(65) Prior Publication Data

US 2005/0176171 A1    Aug. 11, 2005

(30) Foreign Application Priority Data

Apr. 10, 2002   (JP) .............................. 2002-108086

(51) Int. Cl.
   *H01L 21/16* (2006.01)
(52) U.S. Cl. ...................................... 438/106
(58) Field of Classification Search ................ 257/777; 438/106–113, 257, 734–738, 678, 690–691, 438/E33.056
   See application file for complete search history.

(56) References Cited

U.S. PATENT DOCUMENTS 4,790,897 A    12/1988   Long ........................ 156/350
5,173,766 A  * 12/1992   Long et al. ................ 257/687

(Continued)

FOREIGN PATENT DOCUMENTS

EP        0 289 102      11/1988

(Continued)

*Primary Examiner*—Nathan W Ha
(74) *Attorney, Agent, or Firm*—Miles & Stockbridge P.C.

(57) ABSTRACT

A method of manufacturing a thin, small-sized, inexpensive, non-leaded, resin-sealed type semiconductor device is disclosed. A flexible tape having plural terminals peelably through a first adhesive in a product forming portion formed on a main surface of the tape is provided, a semiconductor element is fixed to the main surface of the tape peelably through a second adhesive, electrodes formed on the semiconductor element and the terminals are connected together through conductive wires, an insulating resin layer is formed in an area including the semiconductor element and the wires on the main surface of the tape to cover the semiconductor element and the wires, and the tape on a back surface of the insulating resin layer is peeled, allowing the terminals to be exposed to the back surface of the insulating resin layer. Exposed surfaces of the terminals are each formed by a gold layer. The terminals each comprise a main metal layer of copper foil and one or plural auxiliary metal layers formed on each of a main surface and a back surface of the main metal layer. The auxiliary metal layer(s) on the main surface of the main metal layer is (are) formed using a material which affords a rough surface, thereby roughening the main surface side of each terminal.

17 Claims, 37 Drawing Sheets

U.S. PATENT DOCUMENTS

| | | | |
|---|---|---|---|
| 5,200,362 A | 4/1993 | Lin et al. | |
| 5,298,304 A * | 3/1994 | Narushima et al. | 428/41.7 |
| 6,072,239 A | 6/2000 | Yoneda et al. | 257/730 |
| 6,342,730 B1 * | 1/2002 | Jung et al. | 257/692 |
| 6,348,729 B1 * | 2/2002 | Li et al. | 257/691 |
| 6,429,043 B1 * | 8/2002 | Nakazawa et al. | 438/106 |
| 6,609,297 B1 * | 8/2003 | Hiramatsu et al. | 29/852 |
| 6,903,464 B2 * | 6/2005 | Corisis | 257/784 |
| 2002/0025607 A1 | 2/2002 | Danno et al. | 438/126 |
| 2002/0041019 A1 | 4/2002 | Gang | 257/678 |
| 2003/0015791 A1 * | 1/2003 | Hashimoto | 257/723 |

FOREIGN PATENT DOCUMENTS

| | | |
|---|---|---|
| EP | 0 773 584 | 5/1997 |
| EP | 1 179 844 | 2/2002 |
| JP | 2-244646 | 9/1990 |
| JP | 3-94459 | 4/1991 |
| JP | 10-12773 | 1/1998 |
| JP | 10-116935 | 5/1998 |
| JP | 11-354673 | 12/1999 |
| JP | 2000-77596 | 3/2000 |
| JP | 2001-127199 | 5/2001 |
| JP | 2002-57241 | 2/2002 |
| JP | 2002-76040 | 3/2002 |

* cited by examiner

FIG. 3
(a)
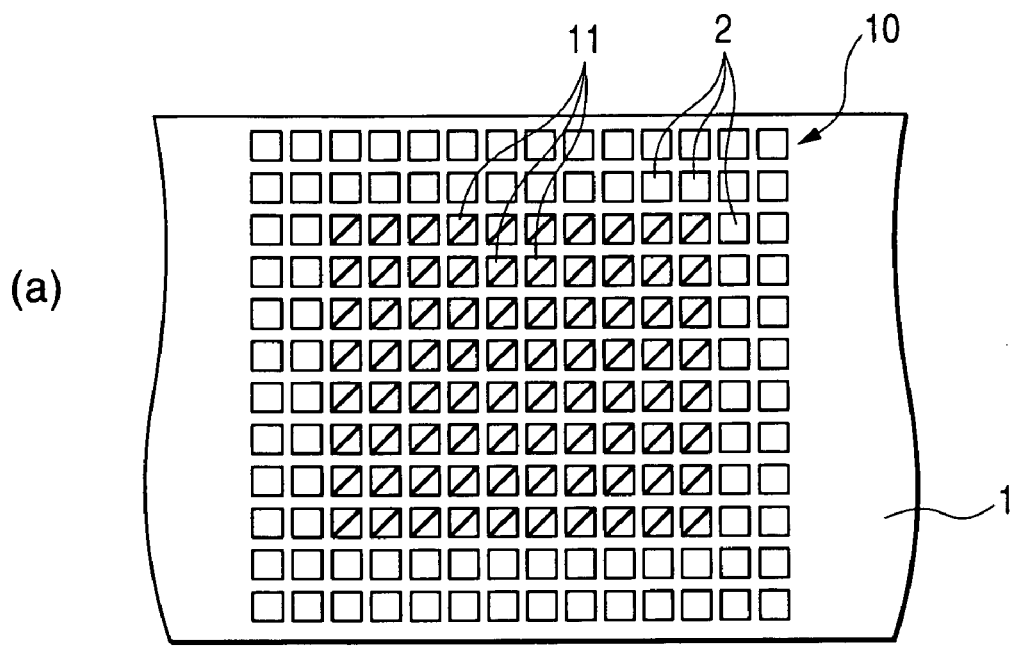
(b)
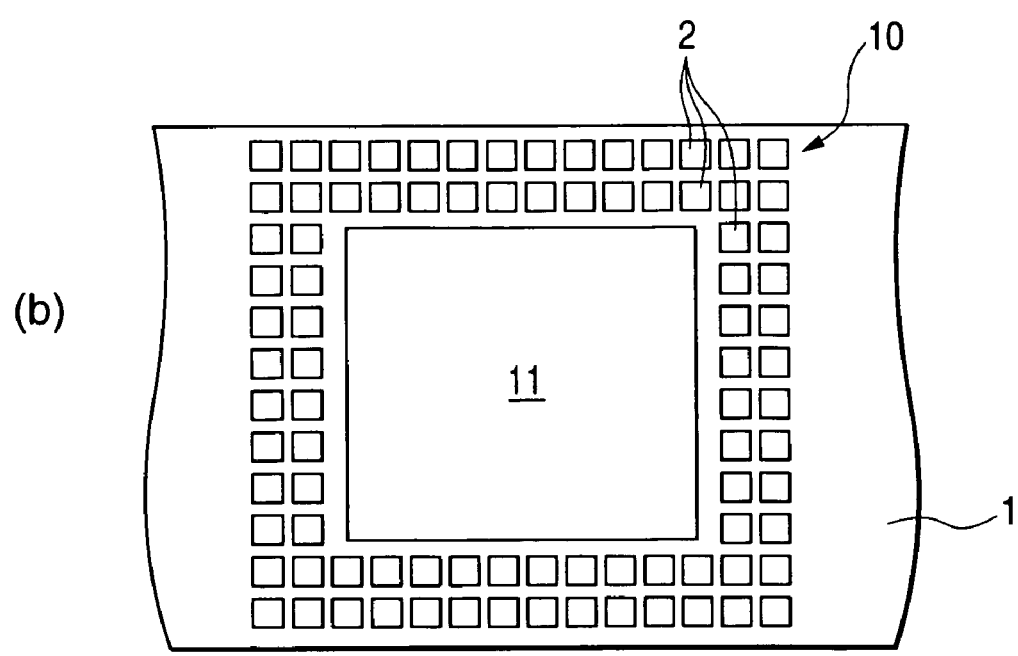

FIG. 50
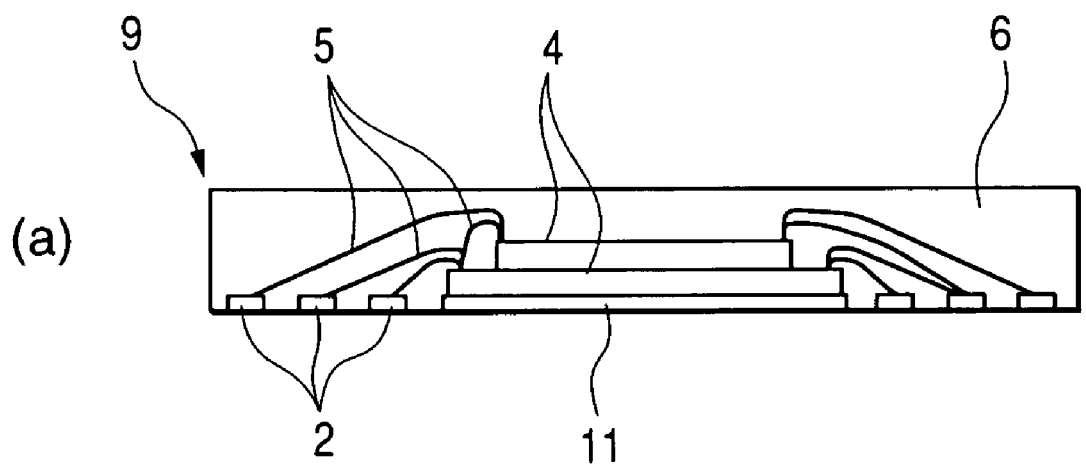
(a)
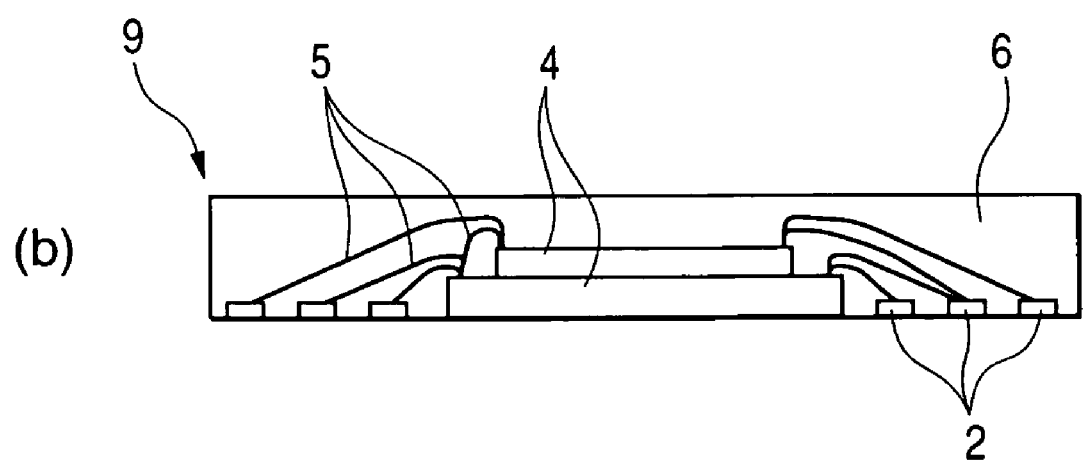
(b)

MANUFACTURING METHOD OF A SEMICONDUCTOR DEVICE UTILIZING A FLEXIBLE ADHESIVE TAPE

BACKGROUND OF THE INVENTION

The present invention relates to a resinsealed type semiconductor device and a method of manufacturing the same. Particularly, the present invention is concerned with a technique applicable effectively to the manufacture of a semiconductor device (nonleaded semiconductor device) such as SON (small outline no leaded package) and QFN (quad flat non-leaded package) in which external electrode terminals are exposed to a packaging side without being intentionally projected sideways of a sealing member.

In manufacturing a resin sealed type semiconductor device there is used a lead frame. The lead frame is fabricated by forming a metallic plate into a desired pattern by punching with use of a precision press or by etching. The lead frame has a support portion called tab or die pad for fixing a semiconductor element (semiconductor chip) and also has plural leads whose front ends (inner ends) are positioned around the said support portion. The tab is supported by tab suspending leads extending from a frame portion of the lead frame.

For manufacturing a resin sealed type semiconductor device with use of such a lead frame, a semiconductor chip is fixed onto the tab of the lead frame,electrodes on the semiconductor chip and the inner ends of the leads are connected together through conductive wires, then the lead inner end side including the wires and the semiconductor chip is sealed with resin so as to fill up a gap and form a sealing member (resin sealing member or package), thereafter unnecessary lead frame portions are cut off and so are the leads and tab suspending leads projecting from the package.

On the other hand, as one of resin-sealed type semiconductor devices manufactured using a lead frame there is known a semiconductor device (non-leaded semiconductor device) in which a package is formed on one side (main surface side) of a lead frame by one-side molding and leads as external electrode terminals are exposed to one surface of the package. As this type of semiconductor devices there are known SON in which leads are exposed to both side edges of one surface of a package and QFN in which leads are exposed to four sides of one surface of a quadrangular package.

In Japanese Unexamined Patent Publication No. 2000-77596 there is disclosed a technique for manufacturing a resin-sealed semiconductor device of an electrode bottom-exposed type which uses two types of lead frames and a resin film. According to this manufacturing technique, first there are provided a lead frame provided inside a frame with leads serving as both a first signal connecting lead portion and a first external terminal portion and leads serving as both a second signal connecting lead portion and a second external terminal portion, as well as a lead frame having a die pad for fixing a semiconductor element.

Next, a resin film is brought into close contact with a bottom of the frame of the former lead frame, while the die pad is taken out of the latter lead frame and is fixed onto the resin film exposed centrally of the frame.

Then, a semiconductor element is fixed onto the die pad, followed by wire bonding, then a sealing resin layer is formed on the frame to cover the semiconductor element and the wires, thereafter the resin film is removed, and the leads projecting from the sealing resin are cut off to fabricate a resin-sealed type semiconductor device in which the external terminals and the die pad are exposed to the back side of the sealing resin layer.

As one of semiconductor devices there is known TBGA (Tape Ball Grid Array) which is fabricated using an insulating tape. In Japanese Unexamined Patent Publication No. Hei 11 (1999)-354673 there is disclosed a semiconductor device wherein, for the reduction of cost and thickness, electrodes are formed on the back side of a molding resin sealing layer using a film carrier tape. The electrodes project from ends of the molding resin sealing layer.

From the standpoint of reducing the size of a semiconductor device and preventing bend of leads serving as external electrode terminals, there are used non-leaded semiconductor devices such as SON and QFN fabricated by one-side molding. In a non-leaded semiconductor device, a lead surface exposed to one side of a package serves as a packaging surface and therefore the packaging area is small in comparison with such a semiconductor device as SOP (Small Outline Package) or QFP wherein leads are projected from side faces of a package, but since external terminals are arranged in one row along an outer periphery of a semiconductor chip, an increase in size of the package is unavoidable with an increase in the number of external terminals, thus giving rise to the problem that such an increase of the package size is unsuitable for constructing a semiconductor device having a larger number of pins. If external terminals are arranged along an outer periphery of a semiconductor chip in the form of an array comprising plural rows and plural columns, as described in Japanese Unexamined Patent Publication No. 2000-77596, there accrues an advantage that a larger number of external terminals can be provided even in a smaller package profile. However, forming such a construction by utilizing a lead frame leads to an increase of cost.

More particularly, in order to ensure a sufficient strength of a lead frame as a frame portion for holding the entire product in each manufacturing step, it is necessary that external terminals be formed using a metallic plate having a sufficient thickness. Thus, it is difficult to reduce the material cost.

Forming a thick metallic plate into a desired pattern with a high accuracy by selective etching or using a precision press is difficult as noted above. In addition, disposing formed external terminal parts onto a resin film requires much time and labor, as described in Japanese Unexamined Patent Publication No. 2000-77596.

On the other hand, in the case of TBGA fabricated using an insulating tape, the tape cost is high, thus obstructing the attainment of reducing the cost of the semiconductor device. That is, the tape which has been used remains within the resulting product because it constitutes a part of the semiconductor device. For ensuring the performance required of product, it is necessary to use a tape of resin (e.g., a tape of polyimide resin) superior in heat resistance and moisture resistance.

Thus, the use of an expensive material is unavoidable, which is a cause of an increase of cost.

Further, wirings are formed on both surface and back surface of the tape, and it is necessary that the wirings be electrically connected with each other through a conductor loaded into a through hole. Thus, also in point of structure, the tape cost becomes high.

SUMMARY OF THE INVENTION

It is an object of the present invention to provide a thin, surface-mounted type semiconductor device and a method of manufacturing the same.

It is another object of the present invention to provide a non-leaded, thin, surface-mounted type semiconductor device wherein terminals are not projected sideways of a sealing member and a method of manufacturing the same.

It is a further object of the present invention to provide an inexpensive, thin and small-sized, non-leaded, resin-sealed type semiconductor device and a method of manufacturing the same.

The above and other objects and novel features of the present invention will become apparent from the following description and the accompanying drawings.

Typical modes of the present invention as disclosed herein will be outlined below.

(1) A flexible tape having plural terminals peelably through a first adhesive in a product forming portion formed on a main surface of the tape is provided, a semiconductor element is fixed in the product forming portion to the main surface of the tape peelably through a second adhesive, electrodes on the semiconductor element and the terminals are connected together through conductive wires, an insulating resin layer is formed in an area including the semiconductor element and the wires on the main surface of the tape to cover the semiconductor element and the wires, and the tape on a back surface of the insulating resin layer is peeled, allowing the terminals to be exposed to the back surface of the insulating resin layer. Exposed surfaces of the terminals are each formed by a gold layer. Each of the terminals comprises a main metal layer formed by copper foil and one or plural auxiliary metal layers formed on each of a main surface and a back surface of the main metal layer. The auxiliary metal layer(s) on the main surface of the main metal layer is formed using a material which affords a rough surface, thereby roughening the main surface side of each terminal.

The above tape is not formed with through hole or wiring. Copper foil or the like is affixed to the tape through a peelable adhesive and is then etched into a predetermined pattern to form terminals.

(2) A flexible tape having plural terminals peelably through a first adhesive in a product forming portion formed on a main surface of the tape is provided, a semiconductor element is fixed in the product forming portion to the main surface of the tape peelably through a second adhesive, electrodes on the semiconductor element and the terminals are connected together through conductive wires, an insulating resin layer is formed in an area including the semiconductor element and the wires on the main surface of the tape to cover the semiconductor element and the wires, and conductors are provided respectively on terminal surfaces exposed to the back surface of the insulating resin layer to form salient electrodes. Each of the terminals comprises a main metal layer formed by copper foil and one or plural auxiliary metal layers formed on each of a main surface and a back surface of the main metal layer. The auxiliary metal layer(s) on the main surface of the main metal layer is formed using a material which affords a rough surface, thereby roughening the main surface side of each terminal.

The above tape is not formed with through hole or wiring. Copper foil or the like is affixed to the tape through a peelable adhesive and is then etched into a predetermined pattern to form terminals.

(3) In the above construction (1) or (2), the product forming portion is provided plurally in a matrix form on the tape, and after fixing the semiconductor element and connection of wires in each of the product forming portions, the insulating resin layer is formed so as to cover the product forming portions, thereafter the tape is peeled from the insulating resin layer, and the insulating resin layer is cut along boundaries between the product forming portions to fabricate plural semiconductor devices.

(4) In the above constructions (1) to (3), a single or plural semiconductor element fixing pieces are formed using the same material as the material of the terminals at the time of forming the terminals on the main surface of the tape, and the semiconductor element is fixed onto the semiconductor element fixing piece(s) through an adhesive.

(5) In the above constructions (1) to (3), the semiconductor element is bonded to the main surface of the tape using an insulating adhesive which is stronger in its bonding force for bonding to the semiconductor element than in its bonding force for bonding to the tape, and the tape is peeled from the insulating resin layer while allowing the adhesive to remain on the back surface of the semiconductor element.

(6) In the above constructions (1) to (5), the terminals are arranged in a matrix form.

(7) In the above constructions (1) to (6), the terminals are positioned inside outer periphery edges of the insulating resin layer.

According to the above means (1), (a) the semiconductor element and terminals are positioned on the main surface of the tape, and after the wire bonding and the formation of the insulating resin layer, the tape is peeled from the insulating resin layer to fabricate a semiconductor device. Thus, it is possible to fabricate a thin semiconductor device.

(b) Since the surfaces of the terminals are rough surfaces, their adherence to the resin which forms the insulating resin layer is high and hence the sealing performance of the insulating resin layer is improved. That is, there is no fear of falling-off of the terminals from the insulating resin layer.

(c) In the present invention, a semiconductor device is manufactured using a tape with terminals arranged on its main surface. This tape is not the conventional expensive tape having wiring patterns, but is a tape not formed with through hole or wiring. Copper foil or the like is affixed to the tape through a peelable adhesive and is then etched into a predetermined pattern to form terminals. Therefore, it is possible to attain the reduction of the semiconductor device manufacturing cost.

According to the above means (2), (a) the semiconductor element and terminals are positioned on the main surface of the tape, and after the wire bonding and the formation of the insulating resin layer, the tape is peeled from the insulating resin layer and then salient electrodes are formed on exposed terminal surfaces to fabricate a semiconductor device. Thus, it is possible to fabricate a thin semiconductor device having salient electrodes.

(b) Since the surfaces of the terminals are rough surfaces, their adherence to the resin which forms the insulating resin layer is high and therefore the sealing performance of the insulating resin layer is improved. That is, there is no fear of falling-off of the terminals from the insulating resin layer.

(c) In the present invention, a semiconductor device is manufactured using a tape with terminals arranged on its main surface. This tape is not the conventional expensive tape having wiring patterns, but is a tape not formed with through hole or wiring. Copper foil or the like is affixed to the tape through a peelable adhesive and is thereafter etched into a predetermined pattern to form terminals. Therefore, the semiconductor device manufacturing cost can be reduced.

(d) Conductors are provided on terminal surfaces exposed to the back surface of the insulating resin layer to form salient electrodes, thus affording a so-called stand-off structure. Therefore, even if fine dust particles are present on a packaging substrate at the time of packaging the semiconductor device, it is possible to effect packaging without any trouble.

According to the above means (3), since product forming portions are provided in a matrix form on the tape and, after the insulating resin layer is formed, the same layer is cut longitudinally and transversely to fabricate semiconductor devices, it is possible to decrease the size of the sealing member formed by the insulating resin layer and a large number of small-sized and thin semiconductor devices can be manufactured at a time.

According to the above means (4), it is possible to fabricate a semiconductor device with a semiconductor element fixed onto a semiconductor element fixing piece(s) formed using the same material as the material of the terminals on the main surface of the tape. With this construction, the back surface of the semiconductor element is protected and therefore the semiconductor element can be made thinner, thus permitting the reduction in thickness of the semiconductor device.

According to the above means (5), the back surface of the semiconductor element is not directly exposed to the back surface of the sealing member formed by the insulating resin layer, but the back surface of the semiconductor element is covered with an insulating adhesive. Thus, an electric insulation on the back side of the semiconductor element can be ensured.

According to the above means (6), since terminals are arranged in a matrix form on the back surface of the sealing member formed by the insulating resin layer, the semiconductor device fabricated has a larger number of external electrode terminals (pins) in a smaller area. Thus, it is possible to attain the reduction in size and an increase in the number of pins of the semiconductor device.

According to the above means (7), the terminals are positioned inside the outer periphery edges of the insulating resin layer, so even if the semiconductor device is mounted in proximity of another electronic part such as another semiconductor device, no short-circuit occurs between it and the electronic part adjacent thereto and hence the packaging reliability is improved.

BRIEF DESCRIPTION OF THE DRAWINGS

FIG. 3 is a schematic plan view of another terminals-arranged tape employable in the semiconductor device manufacturing method of the first embodiment;

FIG. 50a-b is a schematic sectional view of semiconductor devices manufactured by using other terminals-arranged tapes in the method of manufacturing the semiconductor device of the ninth embodiment.

DETAILED DESCRIPTION OF THE PREFERRED EMBODIMENTS

Figure 1:
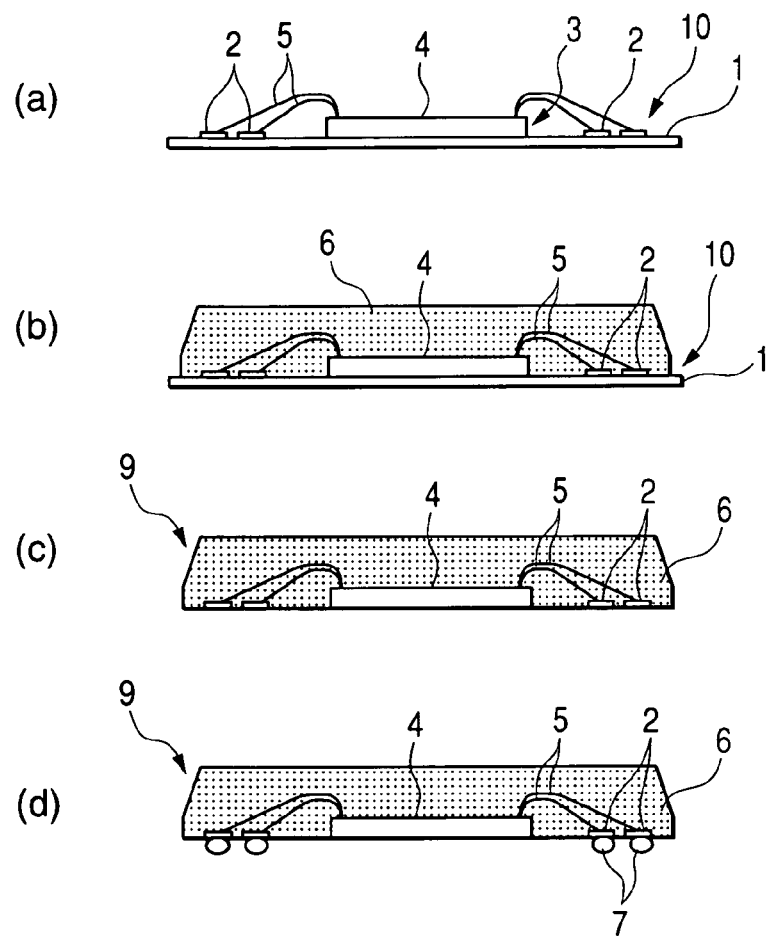
FIG. 1a-d is a schematic sectional view showing manufacturing steps in a semiconductor device manufacturing method according to an embodiment (first embodiment) of the present invention.

Embodiments of the present invention will be described in detail hereinunder with reference to the accompanying drawings. In all of the drawings for illustrating the embodiments, portions having the same functions are identified by the same reference numerals, and repeated explanations thereof will be omitted.

First Embodiment

FIGS. 1 to 6 illustrate a method of manufacturing a non-leaded, resin-sealed type semiconductor device according to an embodiment (first embodiment) of the present invention. In this first embodiment, such a semiconductor device as shown in FIG. 1(d) is fabricated through such steps as shown in FIGS. 1(a) to 1(d).

First, as shown in FIG. 1(a), a flexible tape 1 is provided. Plural terminals 2 are arranged peelably in a predetermined area, i.e., a product forming portion 10, on a main surface of the tape 1. The product forming area 10 is an area in which a semiconductor device is formed and which is quadrangular in shape not only in this embodiment but also in subsequent embodiments.

Figure 2:
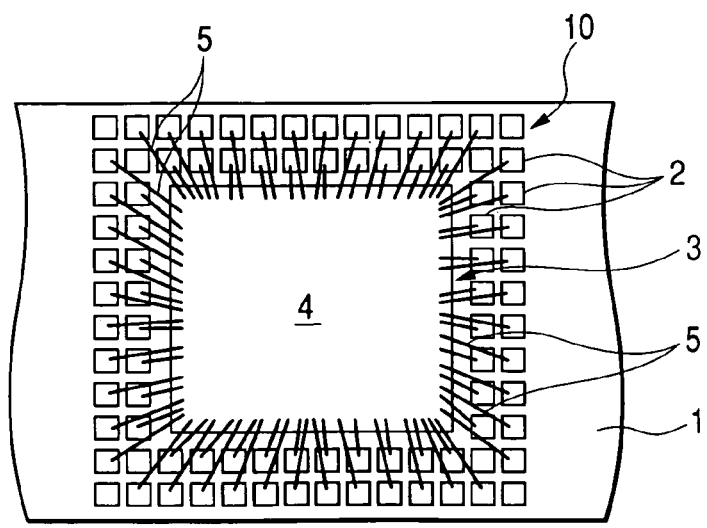
FIG. 2 is a schematic plan view showing a semiconductor element and wires fixed to a terminals-arranged tape in the semiconductor device manufacturing method of the first embodiment.

As shown in FIG. 2, the terminals 2 are arranged in the shape of a quadrangular frame and are arranged at equal intervals in two rows along the four sides of the quadrangle. A quadrangular tape surface located inside the frame serves as a semiconductor element fixing portion 3 for fixing thereto of a semiconductor element. Thus, the terminals 2 are arranged in a matrix form.

It is necessary that the tape 1 be formed by a heat-resistant insulating resin film such as polyimide resin which does not undergo deformation or damage even against heat in each of semiconductor device manufacturing steps. From the standpoint of reducing the cost of the resulting semiconductor device, it is necessary to select a less expensive resin film such as a film of EVA (ethylene-vinyl acetate copolymer) resin or PO (polyolefin) resin. In this first embodiment there is used, for example, a film of PMPP (methacrylate resin). The tape 1 is as thin as 100 μm or so. The same tape will be used also in the embodiments which follow.

The terminals 2 are formed peelably on the main surface of the tape 1. The terminals 2 are formed by (1) affixing a metal foil to the main surface of the tape 1 through an adhesive and thereafter etching the metal foil selectively, (2)

affixing a metal foil to the main surface of the tape 1 by utilizing the adhesiveness of the tape and thereafter etching the metal foil selectively, (3) printing a conductive paste selectively onto the main surface of the tape 1 and then curing the paste, or (4) plating the main surface of the tape 1 with metal and then etching the plating film selectively. Taking connection of wires into account, a plating film or the like is formed on the main surface of each terminal. The terminals, no matter by which of the methods they may be formed, they are in a bonded state peelable from the tape 1. In this embodiment, such an adhesive is designated a first adhesive.

In this first embodiment and subsequent embodiments, reference will be made to an example of using copper foil, copper paste, or copper plating film as a conductor. In the case where a conductor, i.e., a main metal layer, is copper, there may occur a defective connection, depending on the material of wires connected. Therefore, it is necessary that another metal layer be formed on the surface of the main metal layer by plating or printing. For example, when the main metal layer is formed of copper and gold wires are connected thereto, such auxiliary metal layers as Ni plating film and Au plating film are superimposed in this order on the surface (main surface) of the main metal layer and gold wires are connected onto the gold plating film. There may also be adopted a method wherein copper wires are directly connected to copper terminals 2 in an inert atmosphere. In the case where the main metal layer is formed of aluminum, gold wires can be connected thereto.

In the case where the surface of the main metal layer is plated with different metals in a successively superimposed manner, if a Pd plating film as a plating film affording a rough surface is used as an intermediate layer, then when an insulating resin layer to be described later is formed on the main surface of the tape 1, the terminals 2 do not fall off from the insulating resin layer, i.e., a sealing member, because the adhesion between the terminals 2 and the resin which forms the insulating resin layer becomes stronger in the presence of the rough surface. For example, if the main metal layer is a copper layer, plating films are formed successively using Ni, Pd and Au. The surface of the Pd plating film becomes a rough surface. Therefore, the surface of the Au plating film formed on the Pd plating film also becomes rough and eventually main surfaces of the terminals 2 also become rough.

Next, as shown in FIGS. 1(*a*) and 2, a semiconductor element 4 of silicon is fixed to the semiconductor element fixing portion 3 with use of an adhesive (second adhesive) (not shown). This adhesive has such a degree of adhesiveness as permits the semiconductor element 4 to be easily peeled later. The adhesiveness of the tape may be utilized for bonding the semiconductor element 4. The semiconductor element 4 is formed with a predetermined circuit and electrodes (not shown) are formed on a main surface (upper surface) of the semiconductor element 4 so as to run along the sides of the main surface. The thickness of the semiconductor element 4 is set at about 200 to 400 μm, although it is not particularly limited.

Next, as shown in FIGS. 1(*a*) and 2, electrodes on the semiconductor element 4 and the terminals 2 arranged around the semiconductor element 4 are electrically connected with each other through conductive wires 5, e.g., Au wires.

Then, as shown in FIG. 1(*b*), an insulating resin layer 6 is formed on the main surface of the tape 1 so as to cover the semiconductor element 4 and the wires 5. For example, the insulating resin layer 6 is formed by the transfer molding method so as to cover the product forming portion 10. The insulating resin layer 6 is formed at a thickness of not larger than 0.5 mm using, for example, an insulating epoxy resin. The insulating resin layer 6 forms a sealing member and the terminals 2 are arranged inside the edges of the sealing member (insulating resin layer 6). Thus, even the terminals 2 located at the outermost periphery are not exposed to the edges of the sealing member. Therefore, even if the semiconductor device indicated at 9 is mounted onto a packaging substrate in proximity to another electronic part such as another semiconductor device, a short-circuit does not occur between it and the electronic part adjacent thereto and hence the packaging reliability becomes higher.

Next, the tape 1 is peeled from back surfaces of the insulating resin layer 6, the semiconductor element 4 and the terminals 2 to form the semiconductor device 9 in which the back surfaces of the semiconductor element 4 and the terminals 2 are exposed to the back surface of the insulating resin layer 6. In this first embodiment, when the tape 1 is peeled, the first adhesive for the terminals 2 and the second adhesive for the semiconductor element 4 are also removed in an adhered state to the tape 1. The first and second adhesives are selected so as not to cause peeling of the semiconductor element 4 and the terminals 2 from the insulating resin layer 6.

Also in this step (step: S) the semiconductor device 9 can be mounted onto a predetermined packaging substrate with use of the terminals 2. That is, according to the construction of the semiconductor device 9, the terminals 2 can be allowed to function directly as external electrode terminals.

However, in this first embodiment, as shown in FIG. 1(*d*), salient electrodes 7 are formed as external electrode terminals on the back surfaces of the terminals 2 by the following step.

After peeling the tape 1, a predetermined plating film is formed on the back surfaces of the terminals 2 exposed to the back surface of the insulating resin layer 6 and thereafter ball electrodes are attached to the plating film to form the salient electrodes 7. The main metal layer is a copper layer, so for example Ni plating film (auxiliary metal layer) is formed on the back surfaces of the terminals 2 and thereafter solder ball electrodes (solder bump electrodes) made of PbSn solder are attached to the Ni plating film by the conventional ball electrode forming method.

As a result, the external electrode terminals in the semiconductor device 9 become electrodes projecting a predetermined height from the back surface of the insulating resin layer 6, thus affording a so-called stand-off structure. According to this structure, even if dust particles are present slightly on the surface of a packaging substrate such as a mother board at the time of mounting the semiconductor device onto the packaging substrate, the dust particles do not contact the back surface of the insulating resin layer 6 and thus the packaging operation can be done positively.

Even without using ball electrodes, the salient electrodes 7 can also be formed by forming a plating film (auxiliary metal layer) thick on the back surfaces of the electrodes 2 or by printing and curing a conductor paste (auxiliary metal layer) thick on the back surfaces of the terminals, whereby a stand-off structure can be obtained. Even in the stand-off structure wherein external electrode terminals project from the back surface of the insulating resin layer 6, the height of the semiconductor device according to this embodiment can be kept to a value of not larger than 0.5 mm.

Although the tape 1 having terminals 2 arranged in a frame shape within the product forming portion 10 is used in this first embodiment, as shown in FIG. 3(*a*), the semiconductor device can also be fabricated using a tape 1 of the type wherein terminals 2 are arranged in matrix form within the product forming portion 10 and plural terminals 2 located centrally are used as semiconductor element fixing pieces (obliquely lined terminals 2) for fixing thereto of the semiconductor element 4. Since the thickness of each terminals 2 is about 20 to 30 μm, the second adhesive may be used for connection of the semiconductor element 4. Since the groove between adjacent terminals 2 is shallow, the amount of the adhesive used is small and thus does not lead to an increase of cost.

As shown in FIG. 3(*b*), the semiconductor device can also be fabricated by using a tape 1 with terminals 2 arranged in a frame shape within the product forming portion 10 and having a single semiconductor element fixing piece 11 of about the same size as the semiconductor element 4. Thus, not only plural semiconductor element fixing pieces 11 but also a single semiconductor element fixing piece 11 may be used. The shape of the semiconductor element fixing portion using the semiconductor element fixing piece(s) 11 is not limited to the quadrangular shape, but may be any other shape.

Figure 4:
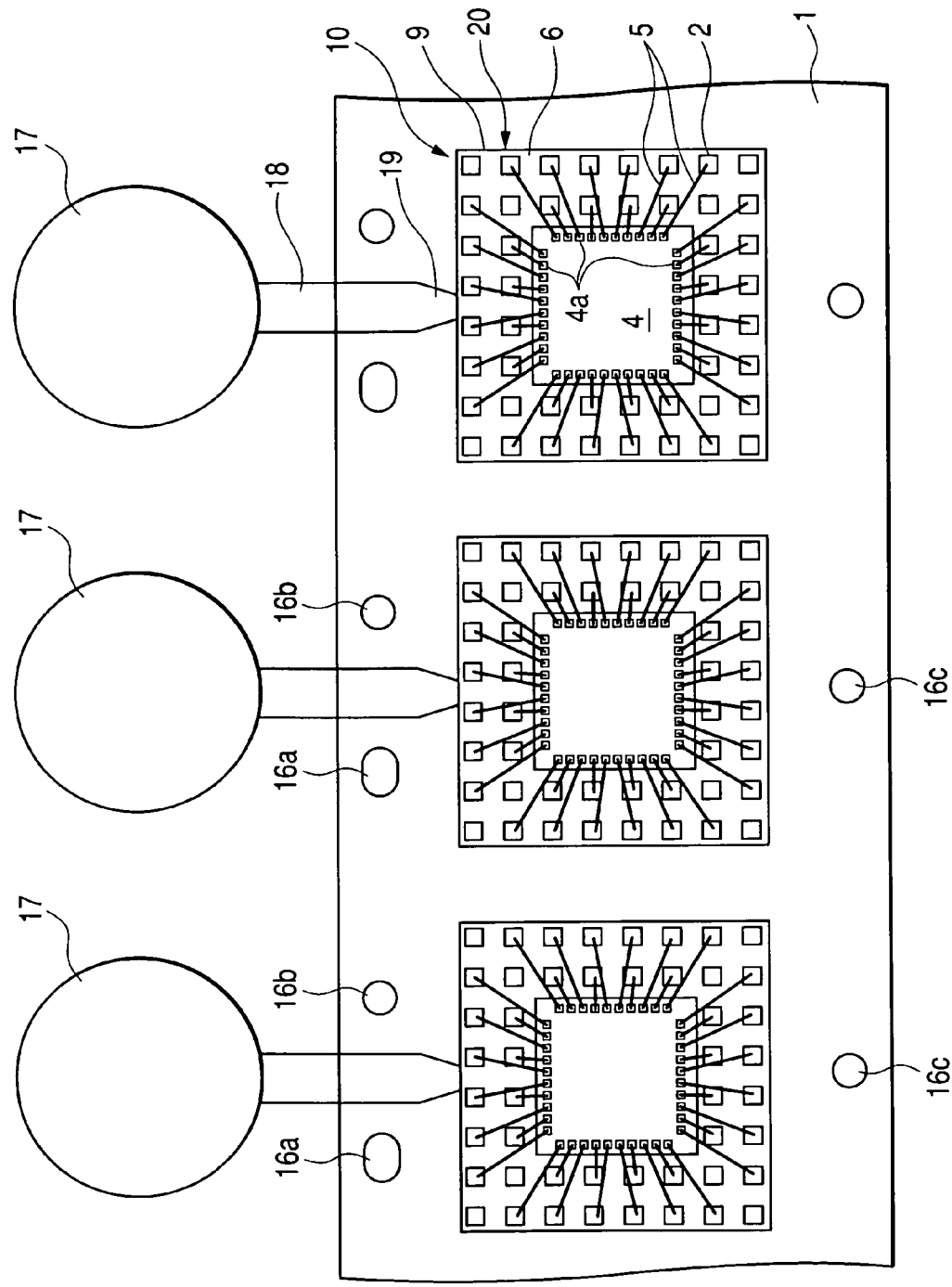
FIG. 4 is a schematic perspective plan view showing a state of molding performed in accordance with a reel-to-reel method in the semiconductor device manufacturing method of the first embodiment.
Figure 5:
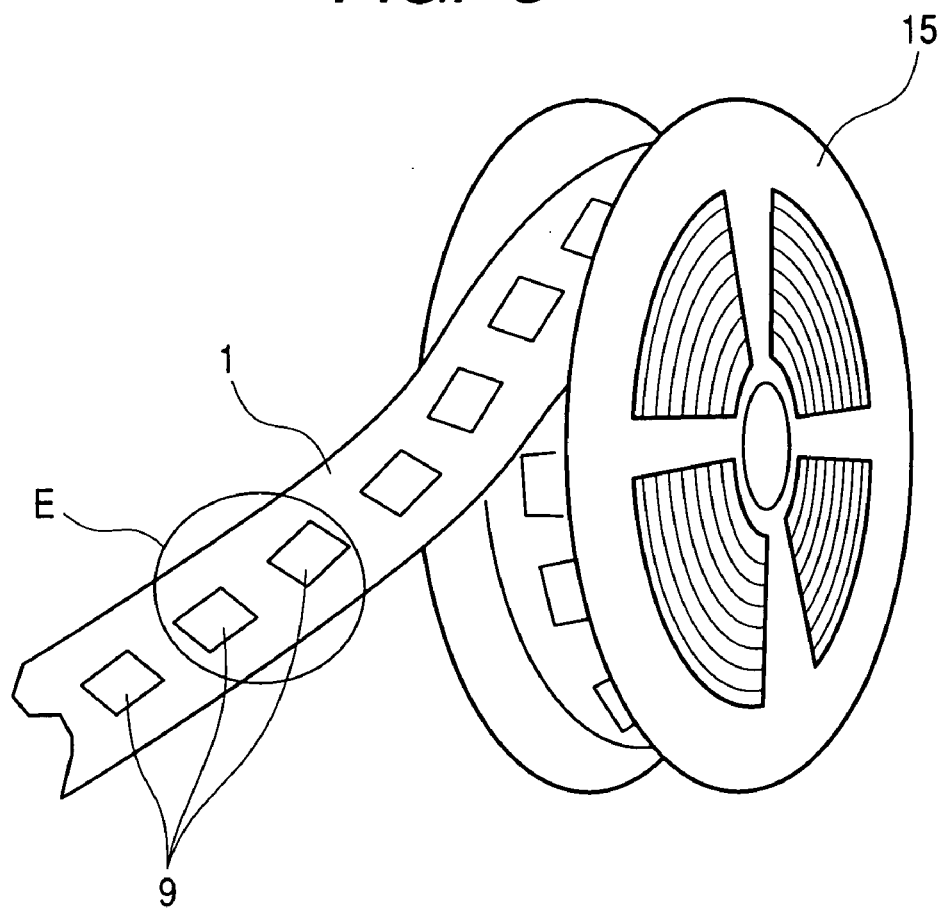
FIG. 5 is a schematic perspective view showing a reel which has taken up semiconductor devices manufactured by the reel-to-reel method.

Although in this first embodiment the tape is peeled from the insulating resin layer, the tape with semiconductor elements 9 affixed thereto may be wound round a reel 15 as in FIG. 5 and in this state the reel 15 may be shipped. In this case, as the tape 1, there is used a band-like tape having on both sides thereof guide holes 16*a* to 16*c* to be used for transfer or positioning of the tape, as shown in FIG. 4. Then, though not shown, the tape 1 after unwound from an unwinding reel is subjected to an assembling work and is then taken up onto a take-up reel.

Figure 6:
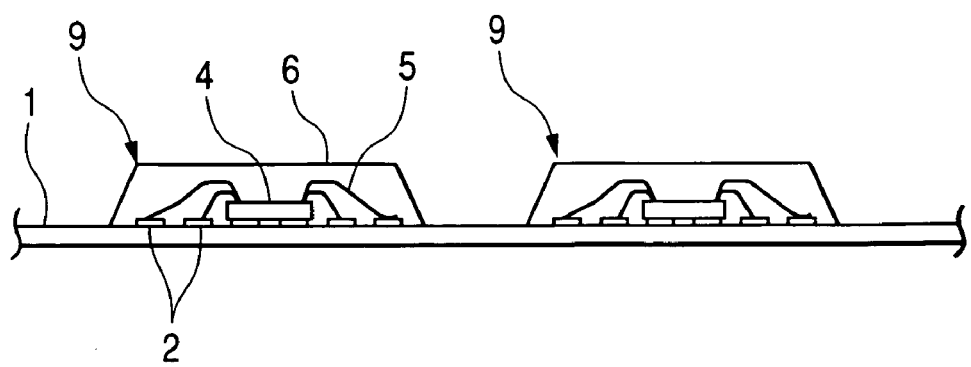
FIG. 6 is a schematic sectional view showing a terminals-arranged tape taken up onto the reel and semiconductor devices formed on the tape.

Thus, each assembling work is performed in accordance with a so-called reel-to-reel method to fabricate semiconductor devices 9 on the main surface of the tape 1, as shown FIG. 6.

FIG. 4 is a schematic perspective plan view showing a state in which semiconductor devices 9, or sealing members, have been formed by a transfer molding apparatus. Resin extruded from each of culls 17 in the transfer molding apparatus is fed into a cavity 20 through a runner 18 and a gate 19 and is then cured therein. In this way there are formed such semiconductor devices 9 (sealing members) as shown in FIGS. 4 and 6. A portion indicated at E in FIG. 5 is shown as an enlarged sectional view in FIG. 6. Electrodes 4*a* formed on the semiconductor element 4 are clearly shown in FIG. 4.

In this case, it is preferable that Ni or Au layer is formed on the tape-bonded side of each of the terminals 2 formed on the tape 1. This is for improving the adhesiveness to the bonding material at the time of packaging each semiconductor device 9. As will be made clear in connection with a tape forming method to be described in a subsequent embodiment, such Ni or Au layer can be formed easily at the time of forming the tape 1.

The semiconductor device manufacturing method using the reel-to-reel method is preferable because not only the workability is high and it is possible to reduce the semiconductor device manufacturing cost but also automatic packaging of the semiconductor device can be done also on the customer side.

A heat-resistant, ultraviolet curing type tape is used as the tape 1, terminals 2 are formed on a main surface of the tape, ultraviolet light is radiated to the ultraviolet curing type tape before peeling the tape from the back surface of the insulating resin layer 6, allowing the bonded portion to cure and deteriorate in adhesiveness, and thereafter the tape 1 is peeled from the back surface of the insulating resin layer 6.

Thus, the tape in question is such a transparent tape as permits ultraviolet light to reach the bonded portion even if the ultraviolet light is radiated from the back surface of the tape.

In the ball electrode forming method, if the timing is just after peeling the tape (or before formation of an oxide film on the surface of the main metal layer), it is possible to form ball electrodes without forming an auxiliary metal layer.

This first embodiment brings about the following effects.

(1) Since the semiconductor device 9 is manufactured by the steps of positioning the semiconductor element 4 and terminals 2 on the main surface side of the tape 1, mounting the wires 5, forming the insulating resin layer 6, and subsequently peeling the tape 1 from the insulating resin layer 6, it is possible to fabricate the semiconductor device 9 which is thin.

(2) Since the surfaces of the terminals 2 are rough, the adhesiveness thereof to the resin which forms the insulating resin layer 6 is high and the sealing performance of the insulating resin layer 6 is improved. That is, the terminals 2 do not fall off from the insulating resin layer 6 and thus the reliability is improved.

(3) In the present invention the semiconductor device 9 is manufactured using the tape 1 with terminals 2 arranged on the main surface of the tape, but the tape 1 is not the conventional expensive tape having wiring patterns, but is not formed with through hole or wiring. Therefore, the manufacturing cost of the semiconductor device 9 can be reduced. If a less expensive tape is used as the tape 1, there can be attained a further reduction of the manufacturing cost. Further, since copper foil or the like is affixed to the tape through a peelable adhesive and is then etched into a predetermined pattern to form terminals, it is possible to attain the reduction of the semiconductor device manufacturing cost.

(4) Since the semiconductor device 9 is manufactured by the steps of positioning the semiconductor element 4 and terminals 2 on the main surface of the tape 1, connecting the wires 5, forming the insulating resin layer 6, subsequently peeling the tape 1 from the insulating resin layer 6, and then forming salient electrodes 7 on exposed terminal surfaces, it is possible to fabricate the semiconductor device 9 which has a stand-off structure of a high packaging performance.

(5) The semiconductor element 4 can be fixed onto the semiconductor element fixing piece(s) 11 which is constituted by a single or plural pieces. With a single semiconductor element fixing piece 11, it is possible to improve the heat dissipating performance and protect the back surface of a chip; besides, since the chip back surface is protected, the chip can be made thinner, thus permitting a further reduction of package thickness. With plural semiconductor element fixing pieces, not only is it possible to improve the heat dissipating performance and protect the chip back surface, but also the standardization of tape can be attained because different sizes of elements can be mounted with use of one tape pattern.

(6) Since terminals 2 are arranged in a matrix form on the back surface of the sealing member constituted by the insulating resin layer 6, the semiconductor device 9 comes to have a larger number of external electrode terminals (pins) in a small area, whereby it is possible to attain a small-sized, multi-pin structure of the semiconductor device 9.

(7) Since the terminals 2 are positioned inside the outer periphery edges of the insulating resin layer 6 (sealing member), even if the semiconductor device is mounted in proximity to another electronic part such as another semiconductor device, a short-circuit does not occur between it and the electronic part adjacent thereto and hence the packaging reliability is improved. In addition, since lands on the packaging substrate side do not protrude (the amount of protrusion is small) from the package profile, it is possible to use the substrate effectively, that is, the substrate can be made small.

(8) If the semiconductor device 9 is manufactured by the reel-to-reel method, the workability is high and it is possible to reduce the manufacturing cost of the semiconductor device 9. On the customer side, by unwinding the tape 1 from the reel 15 and peeling and picking up each semiconductor device 9 from the tape 1, it is possible to attain automatic packaging of the semiconductor device 9 and thus possible to improve the packaging workability.

Second Embodiment

Figure 7:
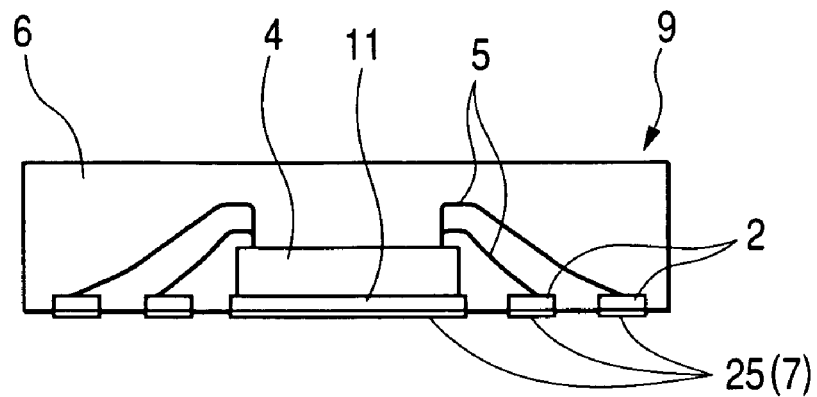
FIG. 7 is a schematic sectional view of a semiconductor device according to another embodiment (second embodiment) of the present invention.
Figure 8:
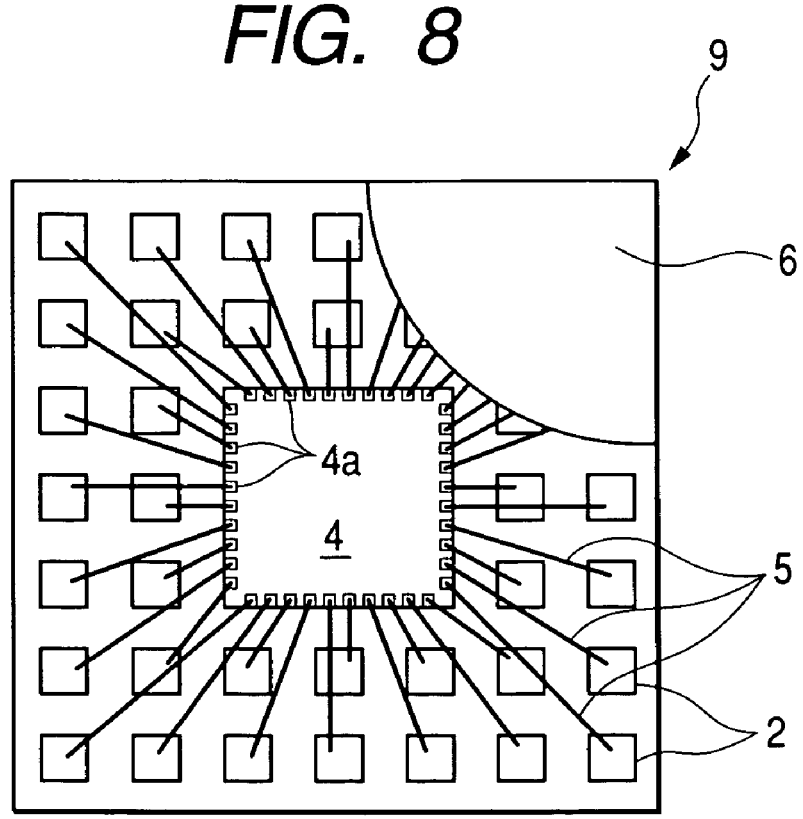
FIG. 8 is a schematic plan view of the semiconductor device of the second embodiment with part of a sealing member removed.
Figure 9:
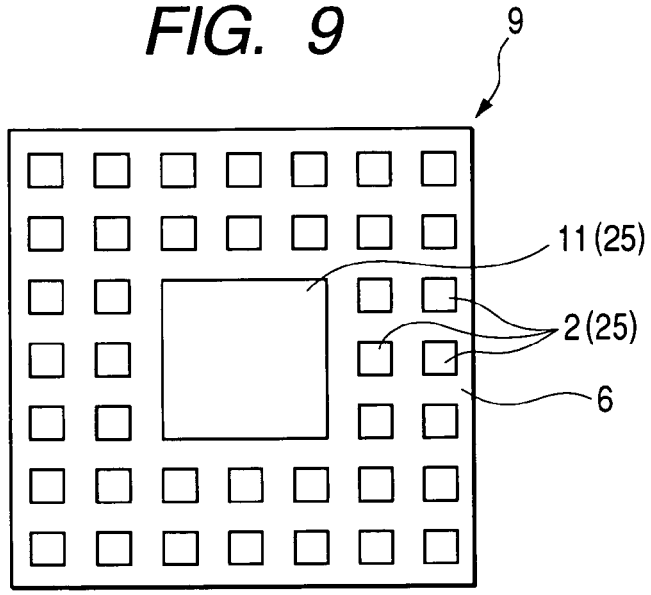
FIG. 9 is a schematic bottom view of the semiconductor device of the second embodiment.
Figure 10:
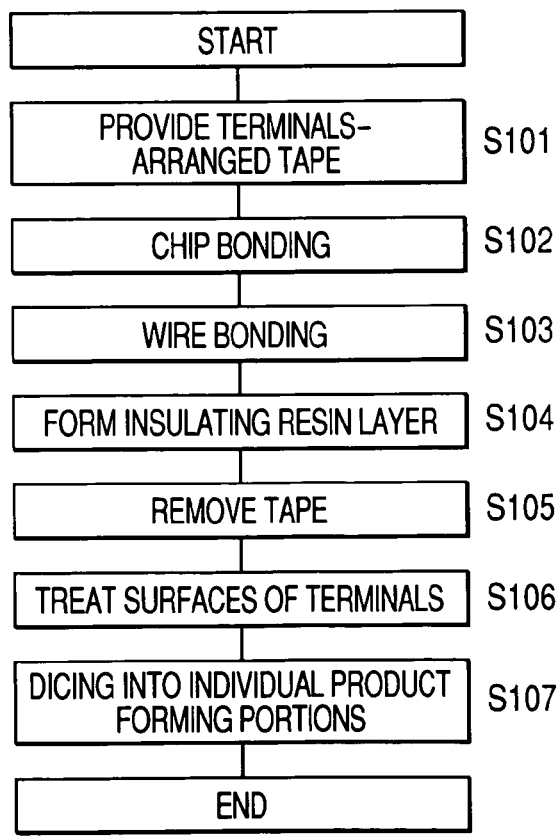
FIG. 10 is a flowchart showing a method of manufacturing the semiconductor device of the second embodiment.

FIGS. 7 to 24 illustrate a semiconductor device and a method of manufacturing the same according to another embodiment (second embodiment) of the present invention, of which FIGS. 7 to 9 are related to the semiconductor device, FIG. 10 is a flowchart showing the semiconductor device manufacturing method, and FIGS. 11 to 24 are related to the semiconductor device manufacturing method.

According to this second embodiment, as a tape corresponding to the tape used in the semiconductor device manufacturing method of the first embodiment there is used a tape with product forming portions arranged in a matrix form of plural rows. A plating film (auxiliary metal layer) is formed on back surfaces of a semiconductor element fixing portion and terminals which back surfaces are exposed to a back surface of an insulating resin layer, to make the terminals into salient electrodes.

Figure 11:
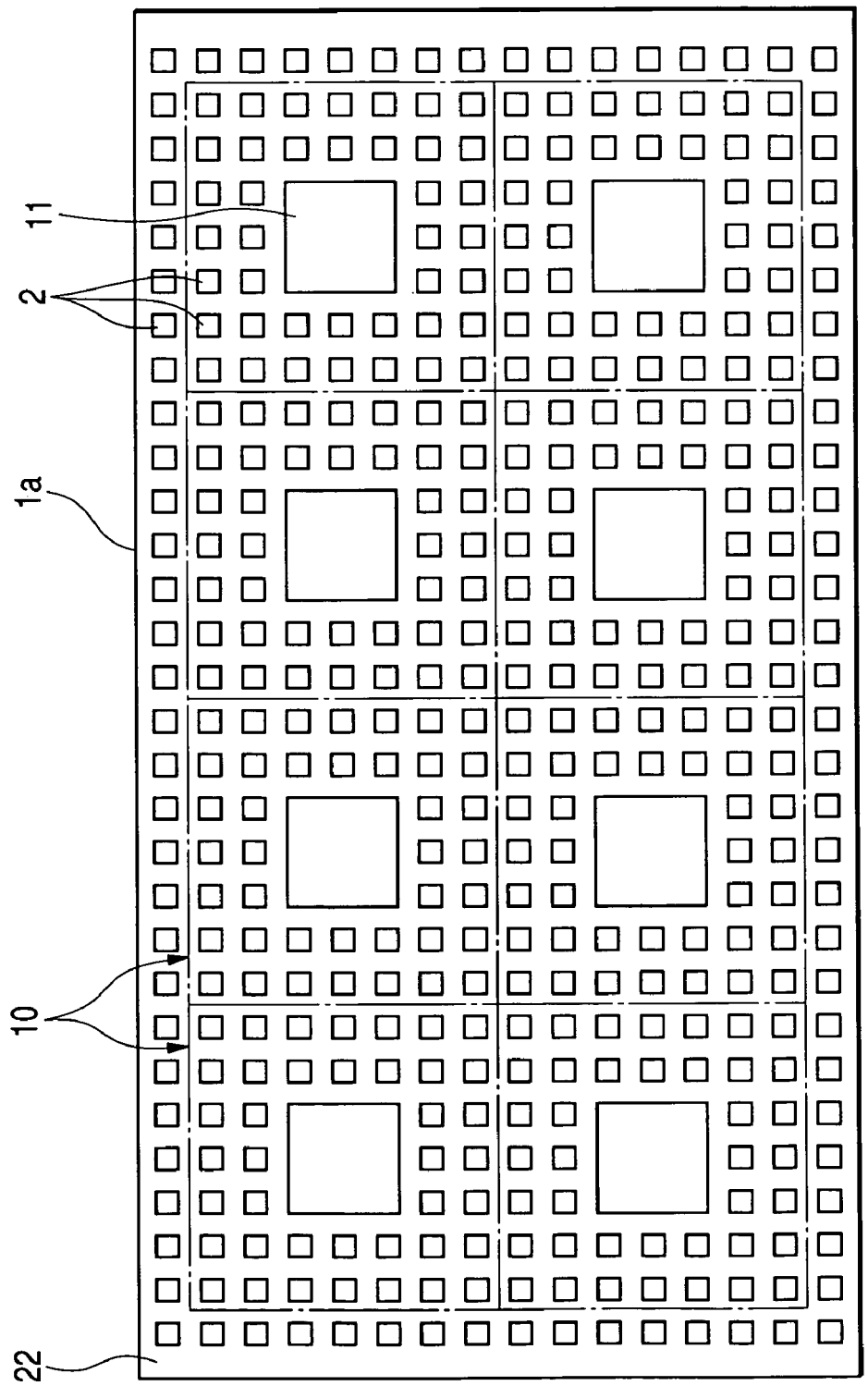
FIG. 11 is a schematic plan view of a terminals-arranged tape used in the method of manufacturing the semiconductor device of the second embodiment.

The tape used in this second embodiment, which tape is indicated at 1a, comprises a frame portion 22 defining peripheral edges and a group of product forming portions 10 located inside the frame portion 22, when viewed in plan as in FIG. 11.

Each product forming portion 10 is a portion for fabricating one semiconductor device 1, and as the tape 1a there is used a terminals-arranged tape of any of the following types: (1) the type [shown in FIG. 1(a)] in which semiconductor elements are fixed directly to the tape, (2) the type [shown in FIG. 3(a)] in which semiconductor elements are each fixed to plural semiconductor element fixing pieces, and (3) the type [shown in FIG. 3(b)] in which semiconductor elements are each fixed to a single semiconductor element fixing piece.

In this second embodiment, reference will be made to an example of manufacturing the semiconductor device with use of a terminals-arranged tape of the above type (3) shown in FIG. 3(b) in which each semiconductor element is fixed to a single semiconductor element fixing piece.

The tape 1a used in this second embodiment has a structure in which a total of eight product forming portions 10 are arranged in a matrix form (2×4) within a quadrangular area inside the frame portion 22. Outside the product forming portions 10, terminals 2 are arranged in one row in the shape of a frame, though this is not always necessary. In the tape used actually in manufacturing the semiconductor device, a larger number of product forming portions are orderly arranged longitudinally and transversely.

The semiconductor device manufactured by the semiconductor device manufacturing method according to this second embodiment has such a structure as schematically shown in FIGS. 7 to 9. FIG. 7 is a sectional view of the semiconductor device 9, FIG. 8 is a plan view of the semiconductor device with part of an insulating resin layer 6 removed, and FIG. 9 is a bottom view of the semiconductor device.

The semiconductor device 9 of this second embodiment is square in shape. This is obtained by dicing the tape 1a together with an insulating resin layer formed on a main surface thereof by means of a dicing blade in a final semiconductor device manufacturing step. Peripheral faces of the semiconductor device 9 are flat faces because of being cut by the dicing blade.

Back surfaces of a semiconductor element fixing piece 11 and terminals 2 are exposed to a back surface of an insulating resin layer 6. The back surfaces of the semiconductor element fixing piece 11, terminals 2 and insulating resin layer 6 are flush with one another. Within the insulating resin layer 6, a semiconductor element 4 is fixed to a main surface of the semiconductor element fixing piece 11, and electrodes 4a on the semiconductor element 4 and the terminals 2 are connected together through wires 5.

A plating film 25 (auxiliary metal layer) is formed on the back surfaces of the terminals 2 and semiconductor element fixing piece 11, whereby the terminals 2 become salient electrodes 7. That is, the external electrode terminals project from the back surface of the insulating resin layer 6 by an amount corresponding to the thickness of the plating film 25, thus affording a stand-off structure. The thickness of the insulating resin layer 6 and that of the plating film 25 are selected so that the thickness of the semiconductor device 9 is not larger than 0.5 mm.

Next, a description will be given about a method of manufacturing the semiconductor device of this second embodiment. As shown in the flowchart of FIG. 10, the semiconductor device 9 is manufactured through the steps of providing a terminal-arranged tape (S101), chip bonding (S102), wire bonding (S103), forming an insulating resin layer (S104), removing the tape (S105), treating surfaces of the terminals (S106), and dicing into individual product forming portions (S107).

Figure 12:
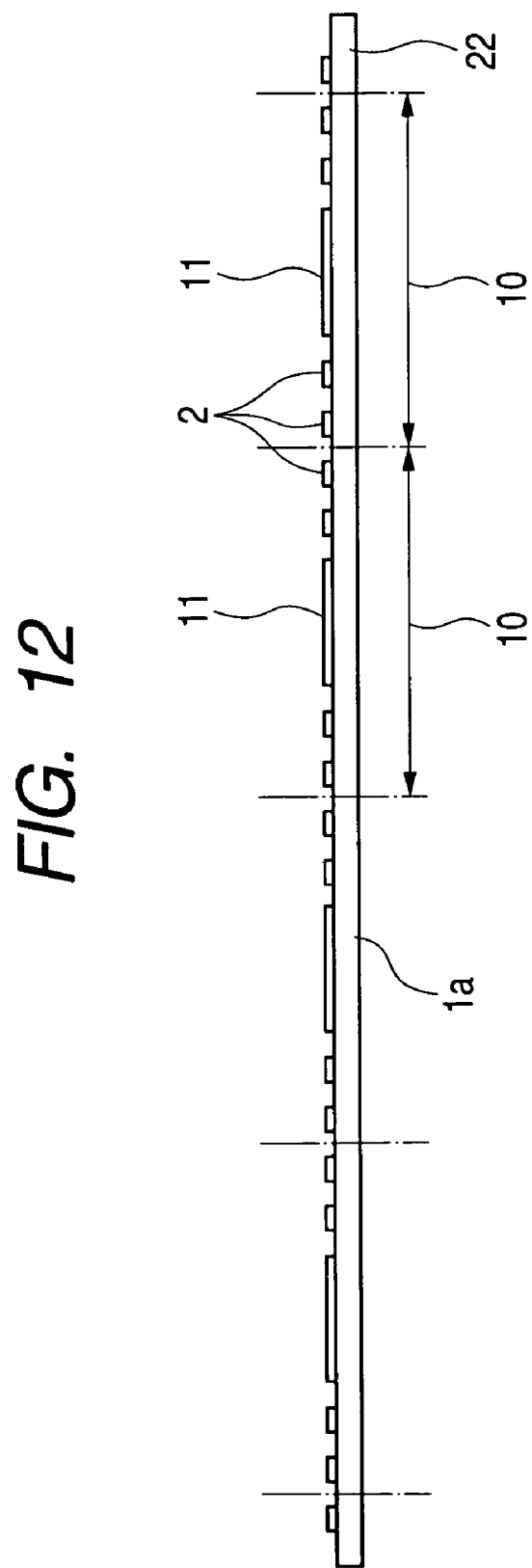
FIG. 12 is a schematic sectional view thereof.
Figure 13:
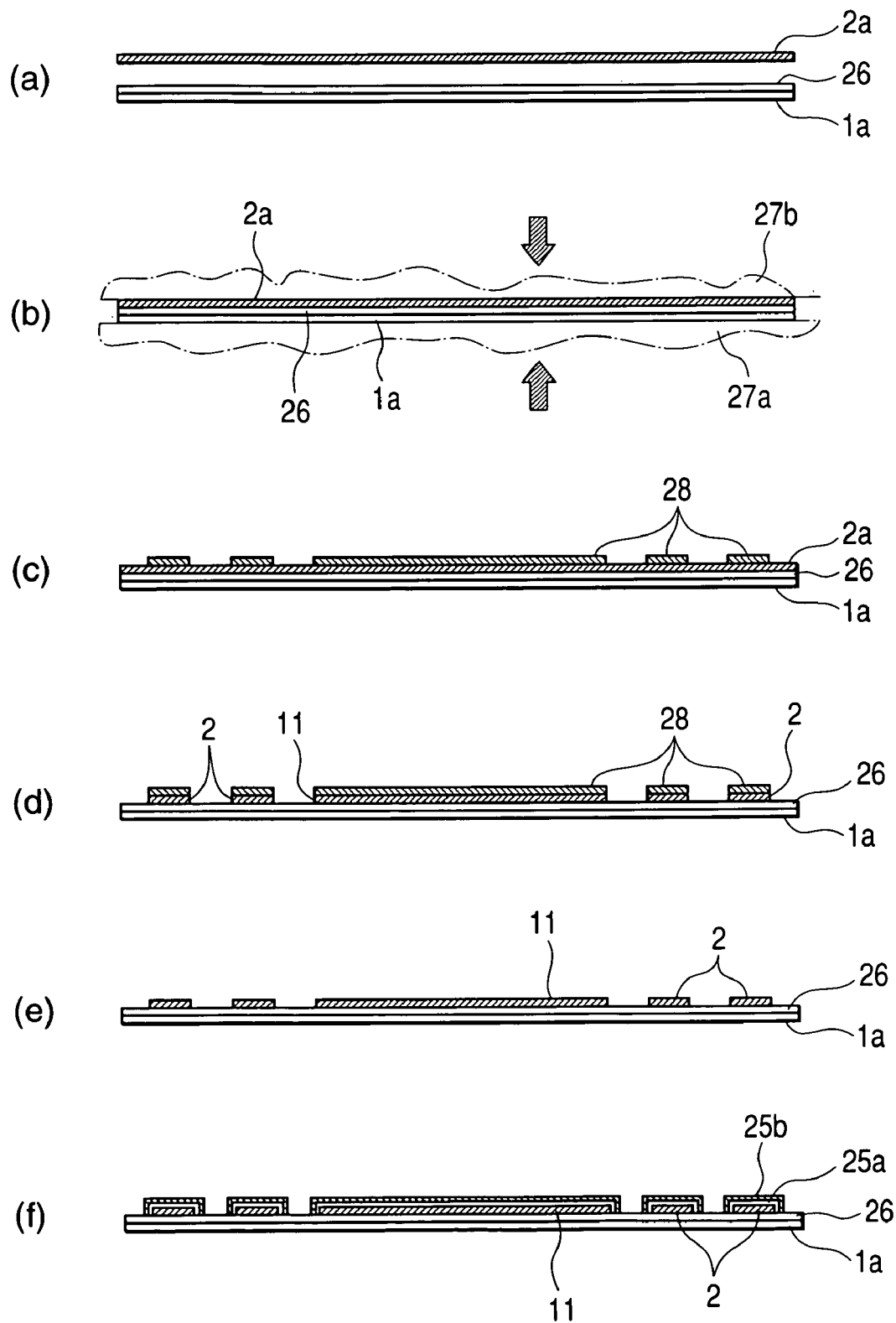
FIG. 13a-f is a schematic sectional view showing an example (foil bonding) of a process for fabricating the terminals-arranged tape used in the second embodiment.
Figure 14:
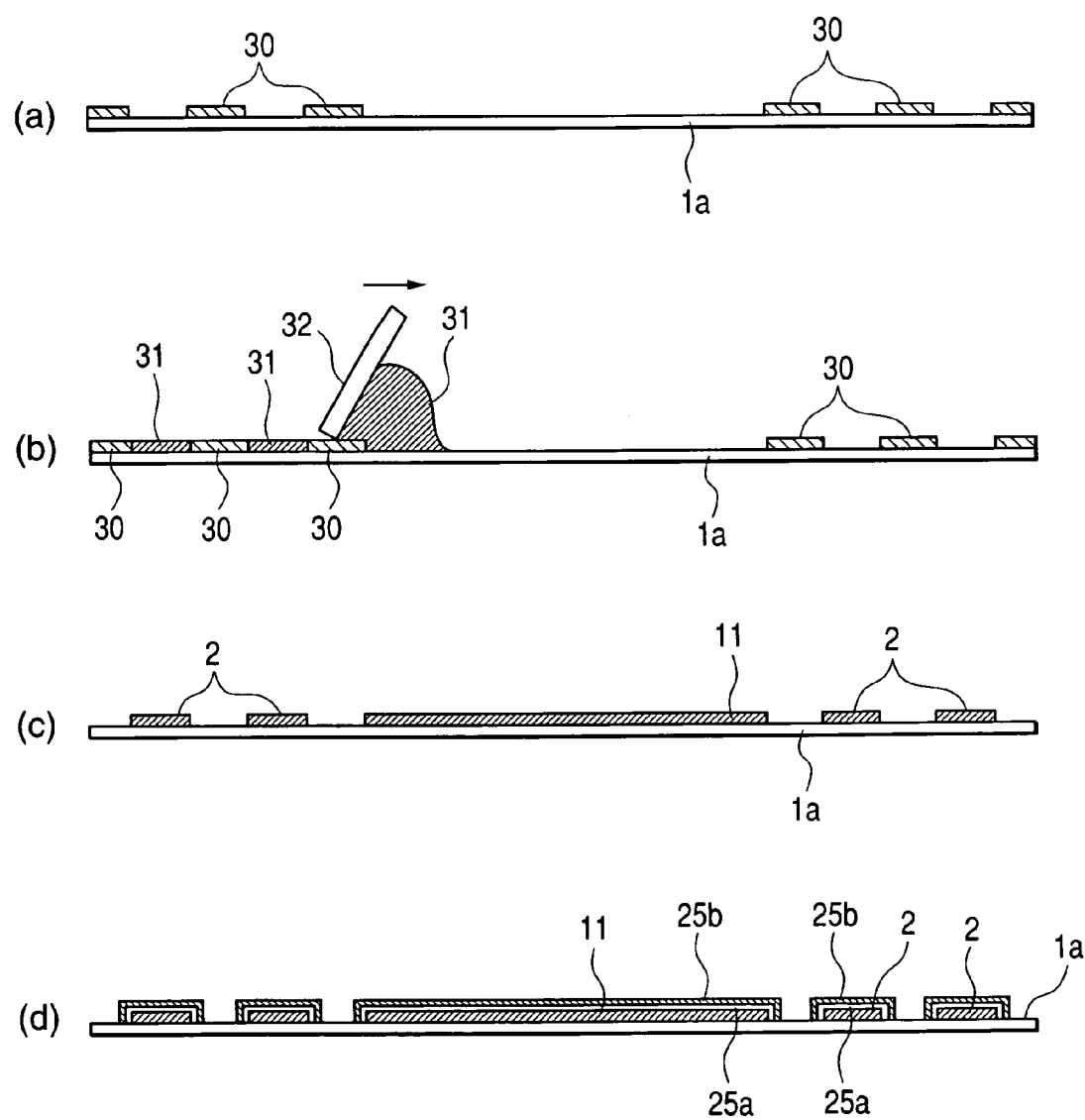
FIG. 14a-d is a schematic sectional view showing another example (printing) of a process for fabricating the terminals-arranged tape used in the second embodiment.
Figure 15:
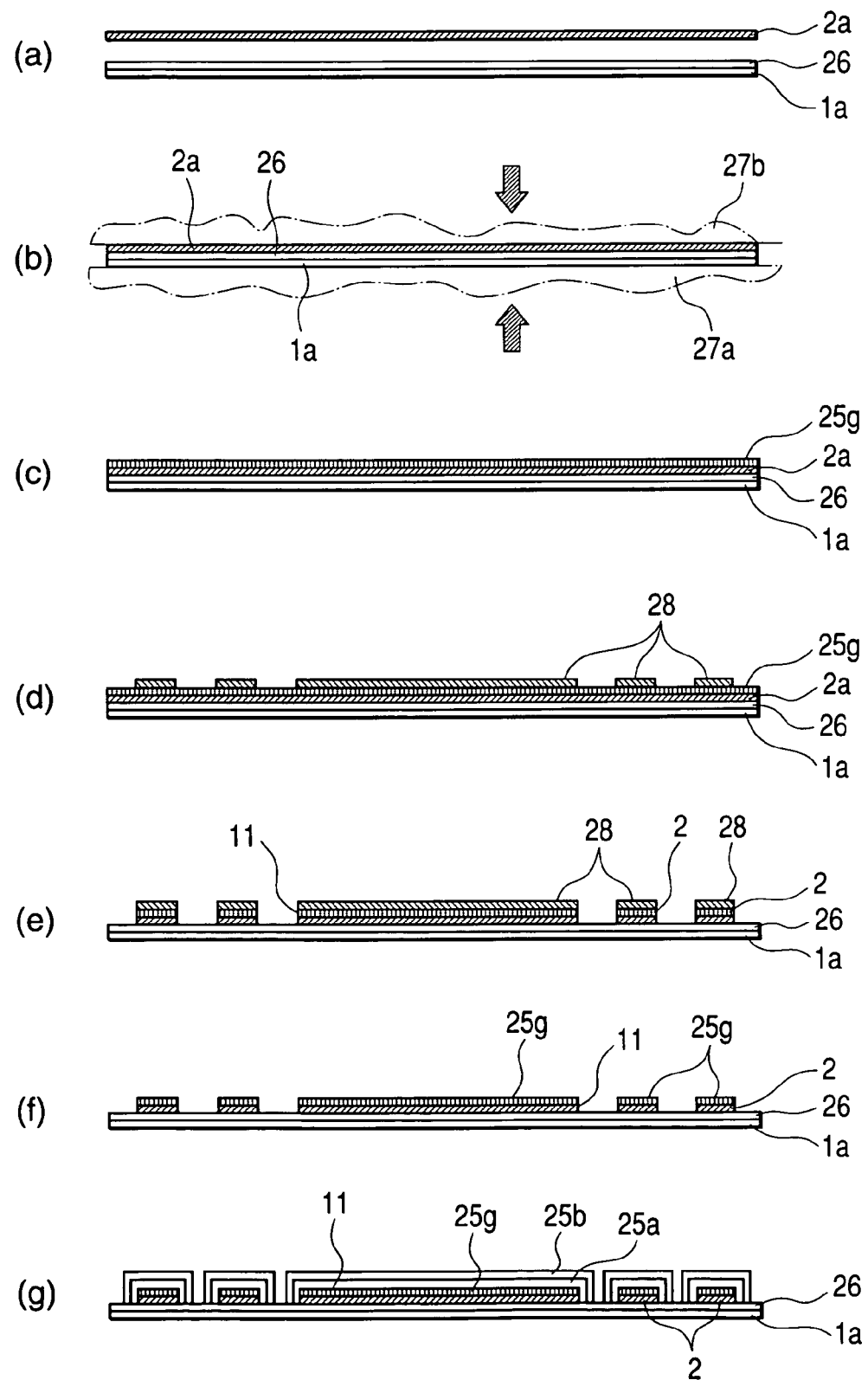
FIG. 15a-g is a schematic sectional view showing a further example (surface roughening) of a process for fabricating the terminals-arranged tape use din the second embodiment.

Reference will first be made to several examples of methods for fabricating the tape 1a (terminals-arranged tape) having such matrix-like product forming portions 10 as shown in FIGS. 11 and 12 which tape is used in this second embodiment.

Tape Fabrication Example 1

The method shown in FIGS. 13(a) to 13(f) is a method of forming terminals by utilizing an electroless plating method. As shown in FIG. 13(a), after the tape 1a is provided, a metal foil 2a is bonded to a main surface of the tape 1a through an adhesive (first adhesive) 26. For example, copper foil is used as the metal foil 2a.

Next, as shown in FIG. 13(b), the tape 1a with the metal foil 2a affixed thereto is sandwiched in between a lower die 27a and an upper die 27b of a press and the metal foil 2a is compression-bonded to the tape 1a by thermocompression bonding.

Then, as shown in FIG. 13(c), a photoresist film 28 is formed on the metal foil 2a selectively by a conventional photolithography technique. More specifically, the photoresist film 28 is not formed in the region where the terminals 2 and the semiconductor element fixing piece 11 are to be formed, but is formed in the other region.

Next, as shown in FIG. 13(d), with the photoresist film 28 as a mask for etching, the metal foil 2a is etched to form the terminals 2 and the semiconductor element fixing piece 11.

Then, as shown in FIG. 13(e), the photoresist film 28 is removed, allowing the terminals 2 and the semiconductor element fixing piece 11 to be exposed.

Next, as shown in FIG. 13(f), by performing electroless plating twice, Ni plating film 25a (auxiliary metal layer) and Au plating film 25b (auxiliary metal layer) are formed in a successively superimposed manner onto the surface of the main metal layer with the terminals 2 and the semiconductor element fixing piece 11 formed thereon.

Tape Fabrication Example 2

The method shown in FIGS. 14(a) to 14(d) is a method of fabricating terminals, etc. by a screen printing method. As shown in FIG. 14(a), after the tape 1a is provided, a metal mask 30 in a screen printer is superimposed on the tape 1a in a closely contacted state. Then, as shown in FIG. 14(b), printing is performed while a conductor paste 31 fed onto the metal mask 30 is pushed against the metal mask 30 by moving a squeegee 32. Areas to be printed of the metal mask 30 are formed as through holes and therefore the conductor paste 31 is charged into the through holes by an amount corresponding to the thickness of the metal mask 30. The through holes are formed correspondingly to the semiconductor element fixing piece 11 and the terminals 2.

A suitable thickness of the conductor paste 31 charged into the through holes can be selected by suitably selecting the thickness of the metal mask 30.

Next, as shown in FIG. 14(c), the metal mask 30 is removed and the conductor paste 31 printed on the main surface of the tape 1a is subjected to baking to form the semiconductor element fixing piece 11 and the terminals 2.

Then, as shown in FIG. 14(d), by performing electroless plating twice, Ni plating 25a (auxiliary metal layer) and Au plating film (auxiliary metal layer) are formed in a successively superimposed manner onto the surface of the main metal layer which the terminals 2 and the semiconductor element forming piece 11 formed thereon.

Tape Fabrication Example 3

The method shown in FIGS. 15(a) to 15(g), as described earlier, is a method of forming the tape 1a in which main surfaces (surfaces) of the terminals 2 are roughened to enhance the adhesiveness thereof to the resin which forms the insulating resin layer 6. According to this method of fabricating the tape 1a, in the steps of FIGS. 13(a) to 13(f) in the Tape Fabrication Example 1, a step of FIG. 15(c) is provided between the step of FIG. 13(b) and the step of FIG. 13(c). The step of FIG. 15(c) involves subjecting a main surface (surface) of the metal foil 2a to electroless plating to form a rough plating film 25g (auxiliary metal layer) having a roughened surface (rough surface). For example, Pd plating film or Cu plating film is formed as the rough plating film 25g.

Subsequently, by repeating the steps of FIGS. 13(c) to 13(f) as steps of FIGS. 15(d) to 15(g), it is possible to roughen the surfaces of the terminals 2 and the semiconductor element fixing piece 11. If a thick film is formed on the rough plating film 25g, the surface is not roughened and therefore a thin film is formed on the rough plating film 25g to afford a roughened surface.

In this second embodiment, after the tape 1a fabricated by any of the above tape fabrication methods is provided, the semiconductor device is manufactured. For example, the tape 1a fabricated by the Tape Fabrication Example 1 is used.

Figure 16:
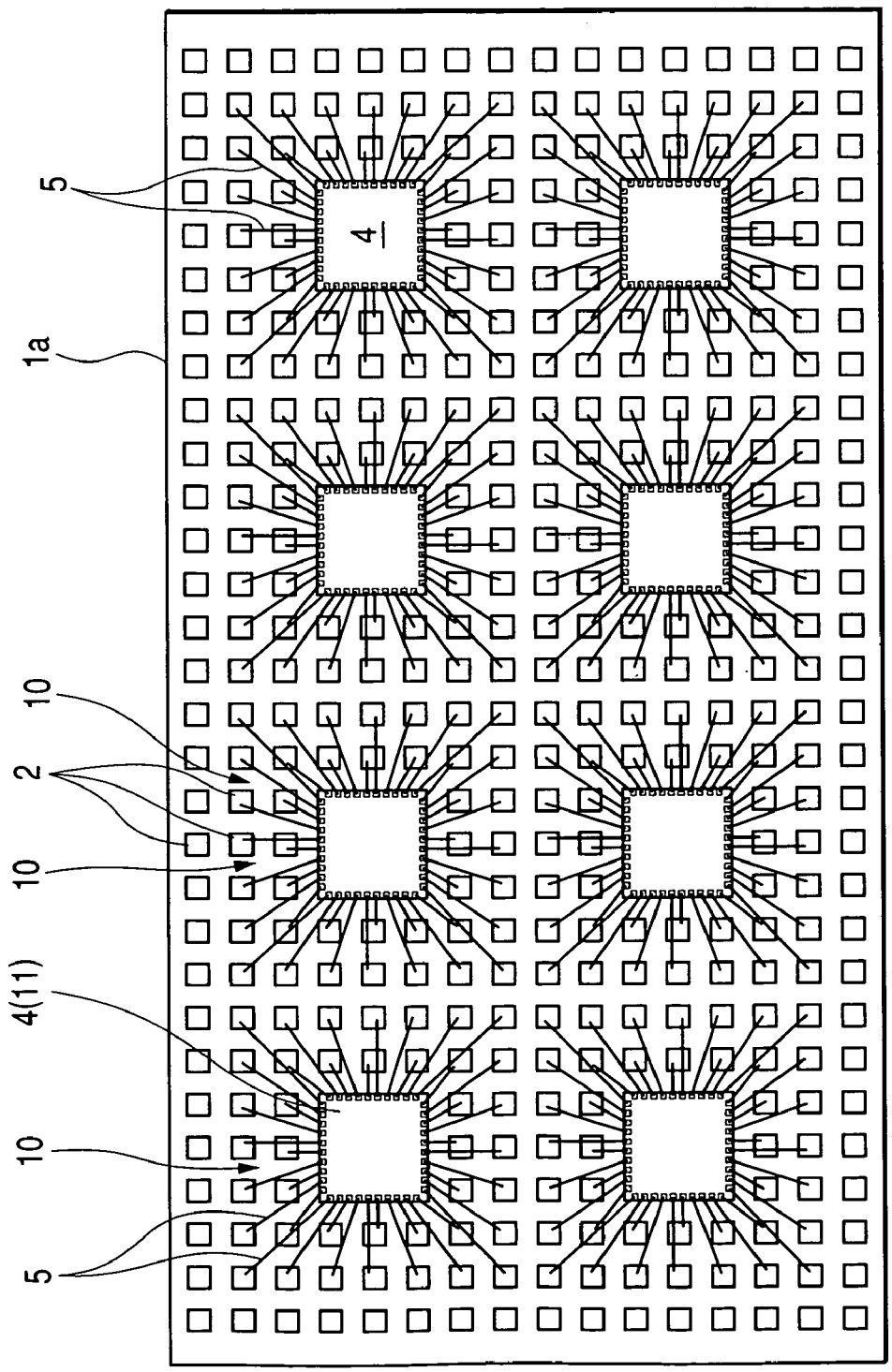
FIG. 16 is a schematic plan view of the terminals-arranged tape after fixing semiconductor elements to a main surface of the tape and after completion of wire bonding in the method of manufacturing the semiconductor device of the second embodiment.

After the tape 1a (terminals-arranged tape) fabricated by the Tape Fabrication Example 1 is provided (S101), a semiconductor element 4 is fixed onto the semiconductor element fixing piece 11 in each product forming portion 10 (S102), as shown in FIG. 16. The semiconductor element fixing piece 11 is slightly larger than the semiconductor element 4, but in FIG. 16 the semiconductor element fixing piece 11 and the semiconductor element 4 are shown in a state of respective profile lines being coincident with each other. This is also true in the subsequent drawings.

Next, as shown in FIG. 16, electrodes 4a on the semiconductor element 4 and the terminals 2 are connected together through wires 5 (S103). Au wires are used in this wire bonding step.

Figure 17:
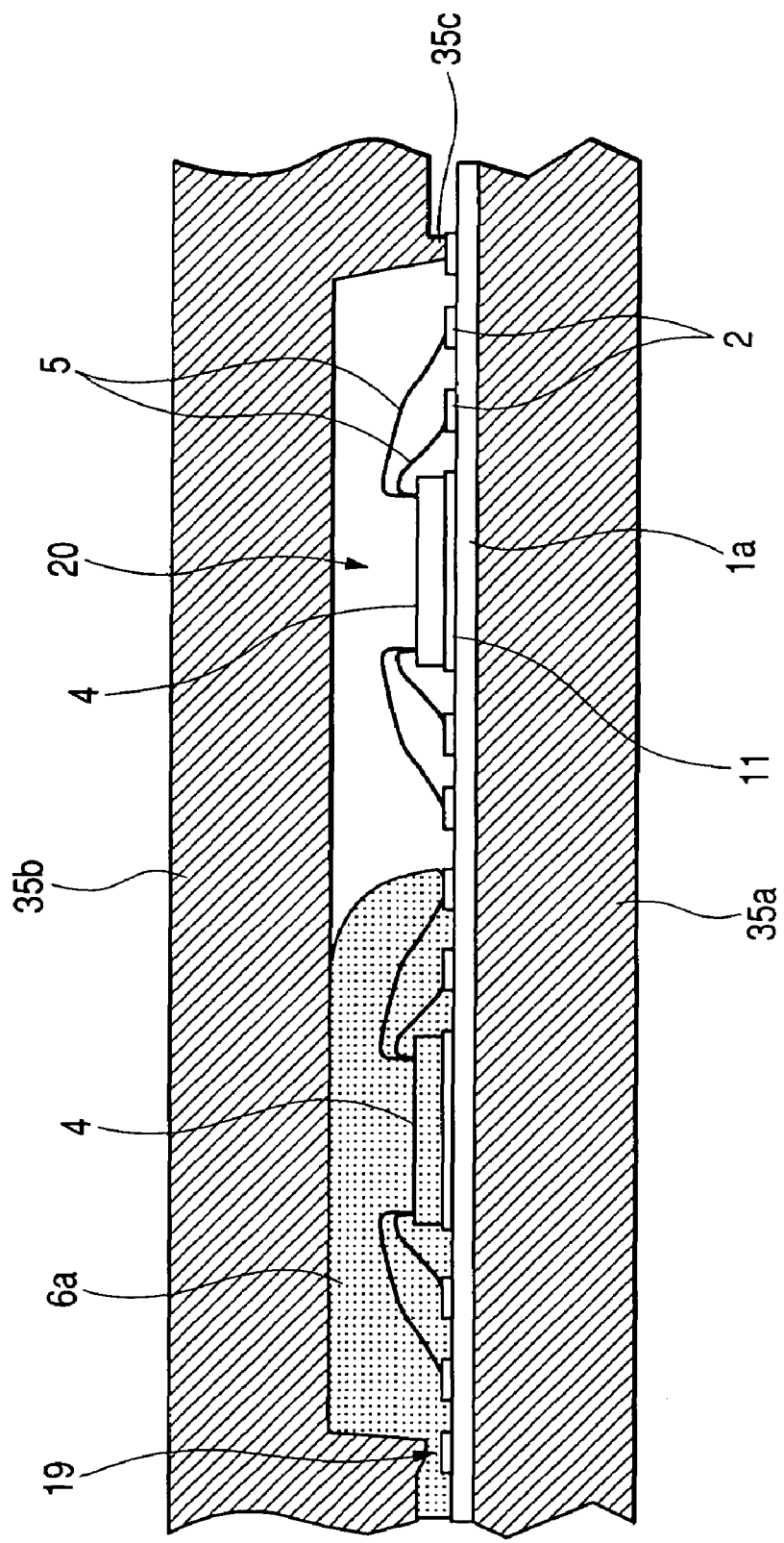
FIG. 17 is a schematic sectional view showing a state of forming an insulating resin layer by transfer molding in the method of manufacturing the semiconductor device of the second embodiment.
Figure 18:
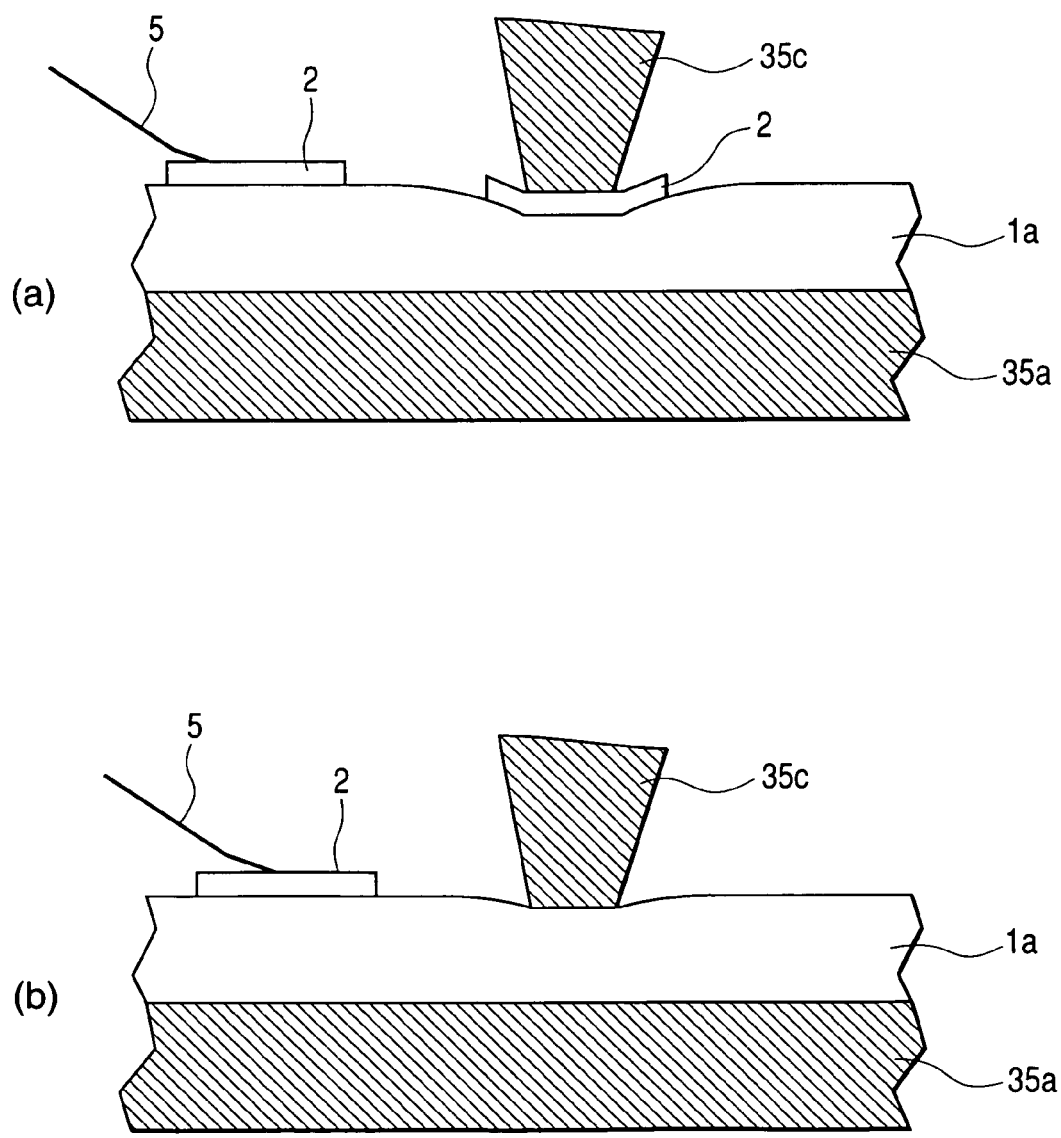
FIG. 18a-b is a schematic diagram showing a state of a parting surface of an upper die of a molding die which bites into the tape in transfer molding.
Figure 20:
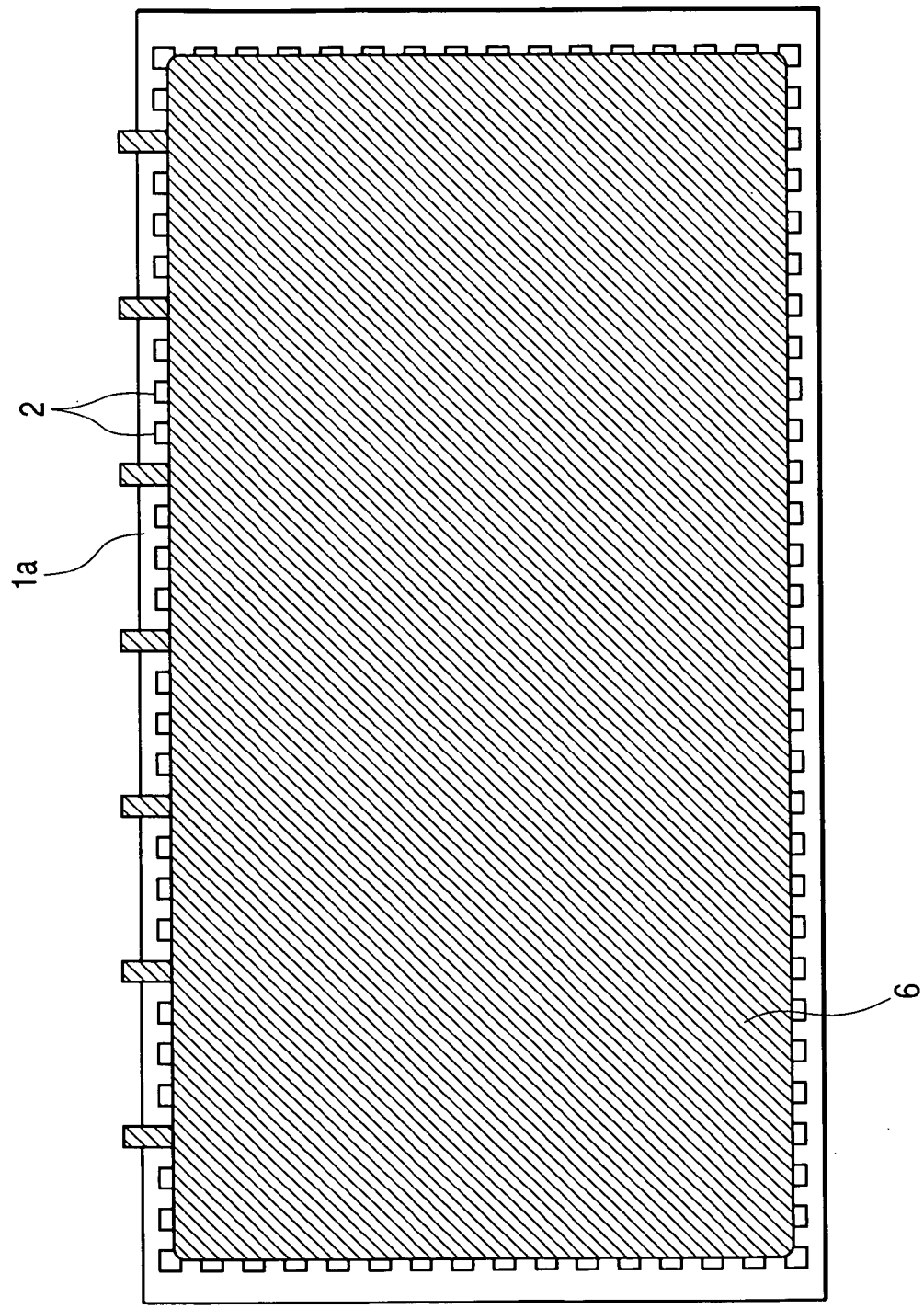
FIG. 20 is a schematic plan view of the terminals-arranged tape with the insulating resin layer formed thereon in the method of manufacturing the semiconductor device of the second embodiment.

Then, as shown in FIG. 17, the tape 1a after chip bonding and wire bonding is clamped by both a lower die 35a and an upper die 35b of a transfer molding apparatus and one-side molding is carried out while injecting molten resin 6a under pressure into a cavity 20 through gates 19 to form an insulating resin layer 6 as shown in FIG. 20 (S104). In this transfer molding, a tip end of a peripheral-edge projecting portion 35c which forms the cavity 20 in the upper die presses down the terminals 2 formed on the main surface of the tape 1a or presses down the tape 1a directly, as shown in FIGS. 18(a) and 18(b). But, in both cases, the tape 1a absorbs distortion and pressing force because it is formed of an elastic material. With deformation of the tape 1a, the peripheral-edge projecting portion 35c of the upper die 35b is certain to contact the tape 1a and the terminals 2, so that a leakage-free cavity 20 is formed.

Figure 19:
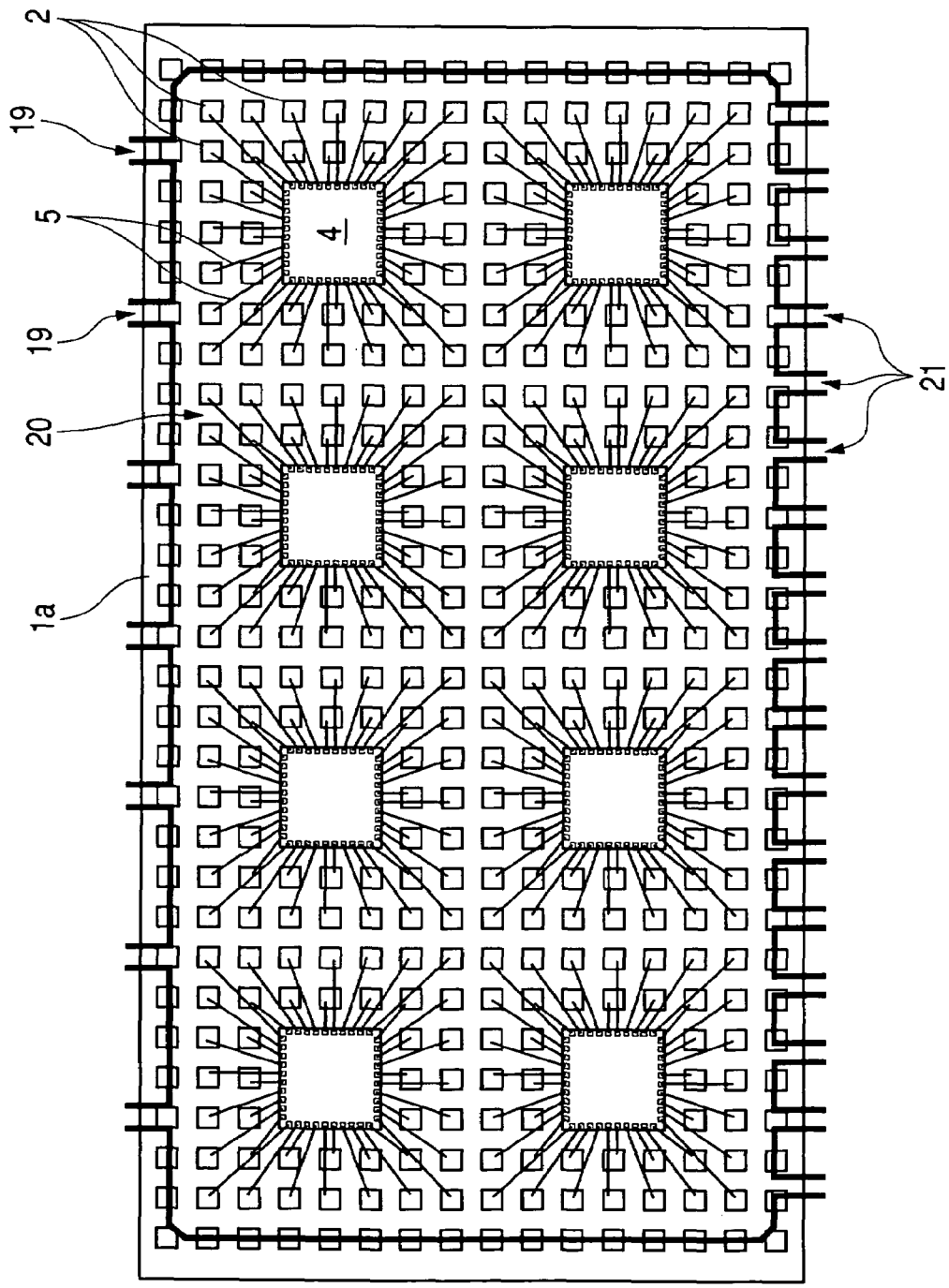
FIG. 19 is a schematic plan view showing a molding area of the terminals-arranged tape.

FIG. 19 is a plan view showing schematically the cavity 20, gates 19 and air vents 21 with respect to the tape 1a. As the tape 1a is removed from the molding die, that is, in the state shown in FIG. 20, the resin which has entered the gates 19 and air vents 21 and cured also remains contiguously to the insulating resin layer 6.

Figure 21:
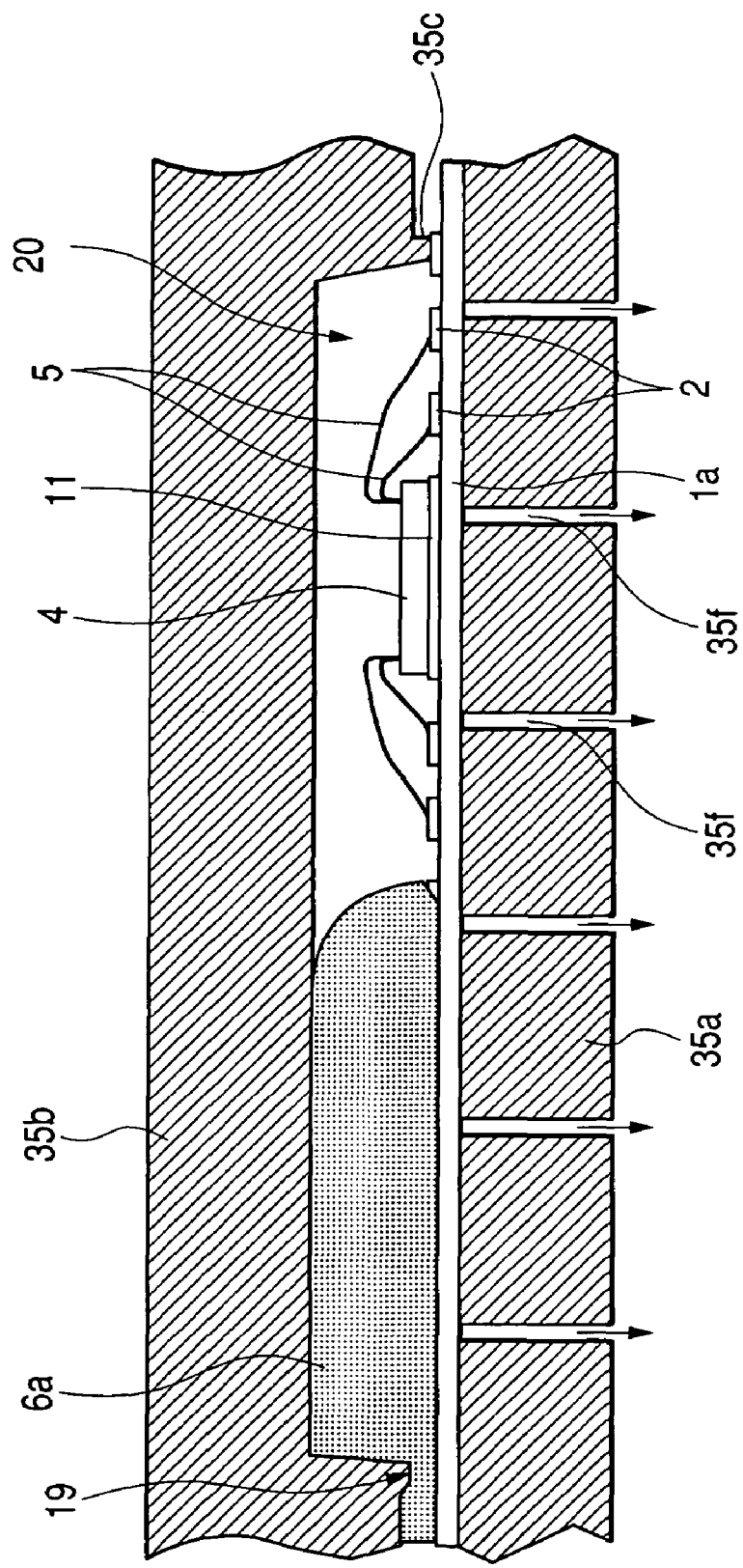
FIG. 21 is a schematic sectional view showing another example of forming the insulating resin layer by transfer molding in the method of manufacturing the semiconductor device of the second embodiment.

In this transfer molding, if there is used such a lower die 35a as shown in FIG. 21, the insulating resin layer 6 can be formed at a predetermined constant thickness.

That is, in the illustrated example, vacuum suction holes 35f are formed in the lower die 35a and vacuum suction is performed through the vacuum suction holes 35f, bringing a back surface of the tape 1a into close contact with a parting surface of the lower die 35a to effect proper molding.

If this method involving vacuum suction of the back surface of the tape 1a to support the tape in a flat and immovable state is applied to the chip bonding and wire bonding which have already been described, the chip bonding and wire bonding can be done positively with a high accuracy.

Figure 22:
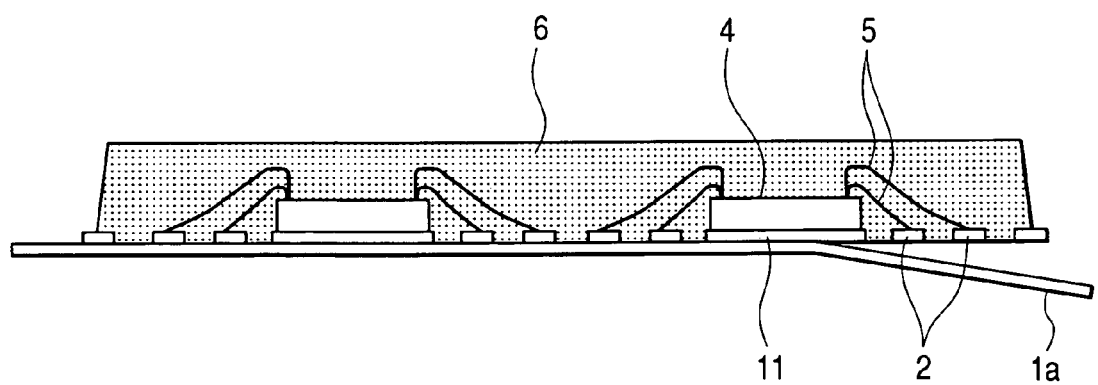
FIG. 22 is a schematic sectional view showing in what state the tape is removed from the insulating resin layer in the method of manufacturing the semiconductor device of the second embodiment.

Next, as shown in FIG. 22, the tape 1a is removed (S105). That is, the tape 1a is peeled from the back surface of the insulating resin layer 6.

Figure 23:
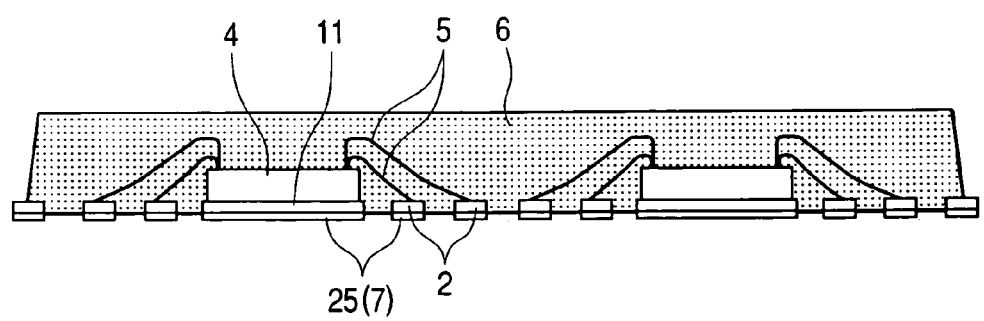
FIG. 23 is a schematic sectional view showing a state in which a film is formed by plating on each of surfaces of terminals exposed to a back surface of the insulating resin layer in the method of manufacturing the semiconductor device of the second embodiment.

Then, as shown in FIG. 23, the terminals 2 exposed to a back surface of the insulating resin layer 6 are subjected to surface treatment (S106). The surface treatment for the terminals is an auxiliary metal layer forming treatment which is carried out by an electroless plating method or by printing of a conductor paste. More specifically, a plating film 25 is formed on back surfaces of the terminals 2 by electroless plating. Because of electroless plating, the plating film 25 is formed also on a back surface of the semiconductor element fixing piece 11 unless there is made masking.

Since the terminals 2 are formed of copper as the main metal layer, the plating film 25 is formed by forming Ni plating film (auxiliary metal layer) as a base layer and Au plating film (auxiliary metal layer) as a surface layer.

As a result, the adhesiveness to the bonding material used in packaging such as PbSn solder is improved. Further, as a result of formation of the plating film 25, the terminals 2 become salient electrodes 7. The salient electrodes 7 as external electrode terminals afford a stand-off structure.

According to the printing method, a conductor layer can be formed on only the back surfaces of the terminals 2. In the printing method, after printing of a conductor paste, baking is performed to evaporate a volatile component, allowing the conductor to cure to form a conductor layer (auxiliary metal layer). This conductor layer becomes the salient electrodes 7.

Figure 24:
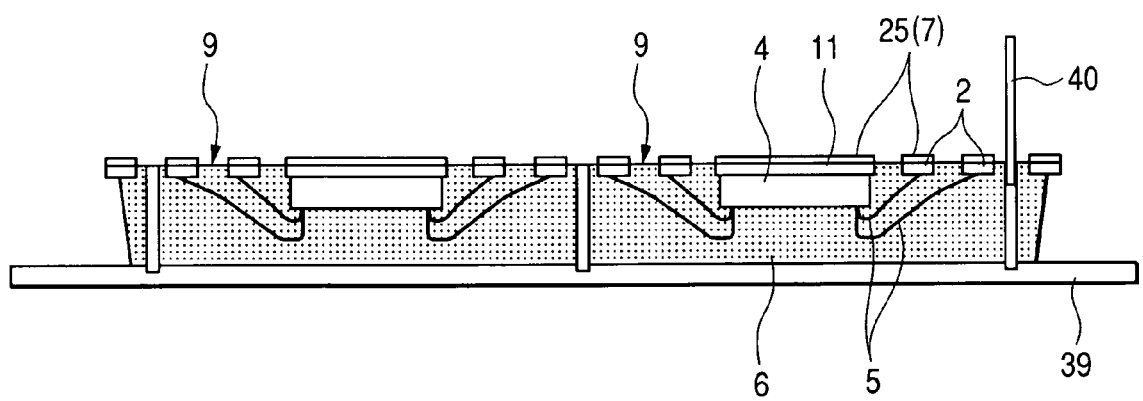
FIG. 24 is a schematic sectional view showing a state in which the insulating resin layer is diced into individual product forming portions in the method of manufacturing the semiconductor device of the second embodiment.

Next, as shown in FIG. 24, a support member (adhesive tape) 39 affixed to a support frame (not shown) is affixed to a main surface of the insulating resin layer 6 and the insulating resin layer 6 is cut from its back surface side up to an intermediate depth of the adhesive tape 39 along boundaries of the product forming portions by means of a dicing blade 40 to dice the insulating resin layer into individual product forming portions, thereby affording semiconductor devices 9 (S107).

The thus-separated semiconductor devices 9 are in an affixed state to the adhesive tape 39. By subsequently removing (peeling) each semiconductor device 9 from the adhesive tape 39, there are obtained plural such semiconductor devices 9 as shown in FIGS. 7 to 9.

Peripheral faces of the insulating resin layer 6 (sealing member) thus cut in a square shape in each semiconductor device 9 are flat faces because of dicing of the insulating resin layer 6 by the dicing blade.

According to this second embodiment, not only there are obtained some of the effects of the first embodiment, but also since the semiconductor devices 9 are fabricated using the tape 1a having product forming portions 10 in a matrix form and by cutting the insulating resin layer 6 longitudinally and transversely, it is possible to minimize the width of the insulating resin layer 6 in the semiconductor device 9 and hence possible to attain the reduction in size of the semiconductor device 9. Moreover, since the tape 1a having product forming portions 10 in a matrix form is used and there is adopted a block molding method and since the insulating resin layer 6 is diced longitudinally and transversely by the dicing blade, a large number of semiconductor devices 9 can be manufactured at a time and the manufacturing cost of the non-leaded type semiconductor devices 9 can be reduced. Further, in cutting the block-molded product, if marks are put on the transparent molding resin or on the frame (tape), the cutting work can be effected without peeling the tape 1a (without re-affixing of the tape 39). As a result, it is possible to attain the simplification of the process and the reduction of the manufacturing cost, whereby it is possible to attain the reduction of cost of each product.

According to this second embodiment, a large number of thin and small-sized, non-leaded semiconductor devices 9 can be manufactured at a time by using a thin tape 1a and forming the insulating resin layer 6 thin.

At the time of forming the resin layer by transfer molding in this second embodiment, if there is adopted the method wherein the tape 1a is brought into close contact with the resting surface (parting surface) of the lower die 35a by vacuum suction, the insulating resin layer 6 can be formed positively with a high accuracy. Thus, it is possible to manufacture non-leaded semiconductor devices 9 of a good quality.

Third Embodiment

Figure 25:
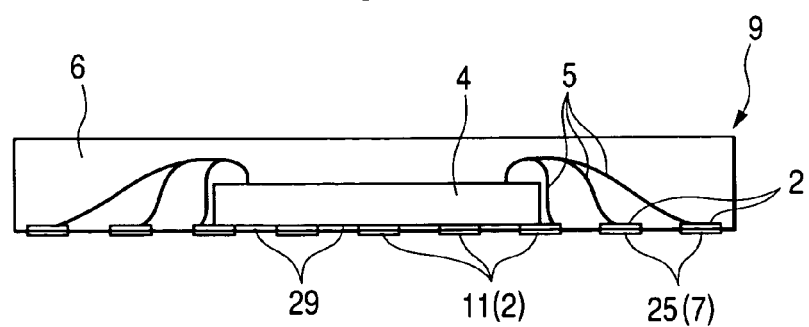
FIG. 25 is a schematic sectional view of a semiconductor device according to a further embodiment (third embodiment) of the present invention.
Figure 26:
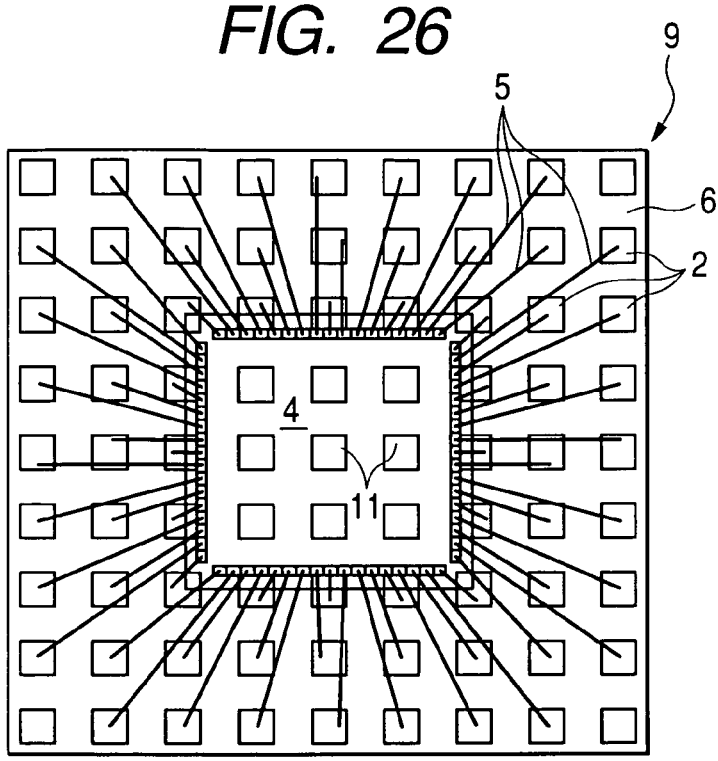
FIG. 26 is a schematic perspective plan view thereof.
Figure 27:
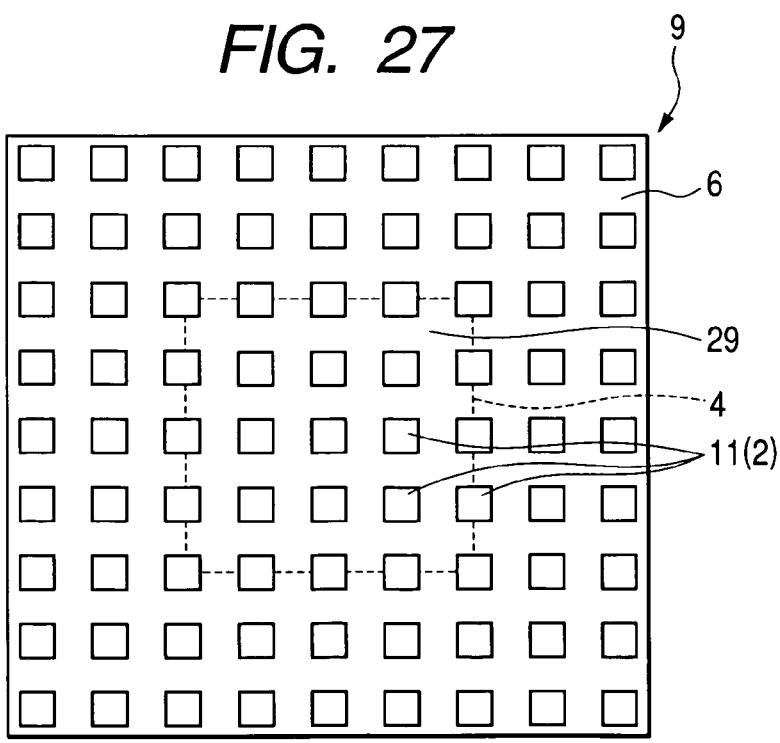
FIG. 27 is a schematic bottom view thereof.

FIGS. 25 to 27 are related to a semiconductor device according to a further embodiment (third embodiment) of the present invention. The semiconductor device of this third embodiment is fabricated by using a tape having product forming portions arranged in a matrix form, with terminals being arranged in a matrix form in each of the product forming portions.

FIG. 25 is a schematic sectional view of the semiconductor device, indicated at 9, according to this third embodiment, FIG. 26 is a schematic perspective plan view of the semiconductor device, and FIG. 27 is a schematic bottom view thereof. In the semiconductor device 9 of this third embodiment, as shown in these figures, terminals 2 are arranged in a matrix form on a back surface of a quadrangular insulating resin layer 6. Outer edges of the terminals 2 located on the outermost side are also positioned inside the edges of the insulating resin layer 6.

A semiconductor element 4 is fixed onto plural terminals 2. That is, this third embodiment is characteristic in that plural semiconductor element fixing pieces 11 are used to fix the semiconductor element 4. An adhesive (second adhesive) 29 for fixing the semiconductor element 4 gets into grooves formed between adjacent terminals in the area where the semiconductor element 4 is fixed. Since the thickness of each terminal 2 is about 20 to 30 μm, the depth of each groove is also about 20 to 30 μm, and the amount of the adhesive 29 is not so large as causes a great increase in the cost of the semiconductor device 9.

Also in the semiconductor device 9 of this third embodiment, a plating film 25 is formed on the terminals 2 whose back surfaces are exposed to the back surfaces of the insulating resin layer 6 to form salient electrodes 7, thereby affording a stand-off structure.

According to the structure of the semiconductor device 9 of this third embodiment, the semiconductor element 4 is mounted on plural terminals 2. That is, since there is used a tape having product forming portions arranged in a matrix form, package bodies of different sizes can be manufactured using the same molding die in molding, whereby it is possible to diminish the investment in manufacturing equipment.

Fourth Embodiment

Figure 28:
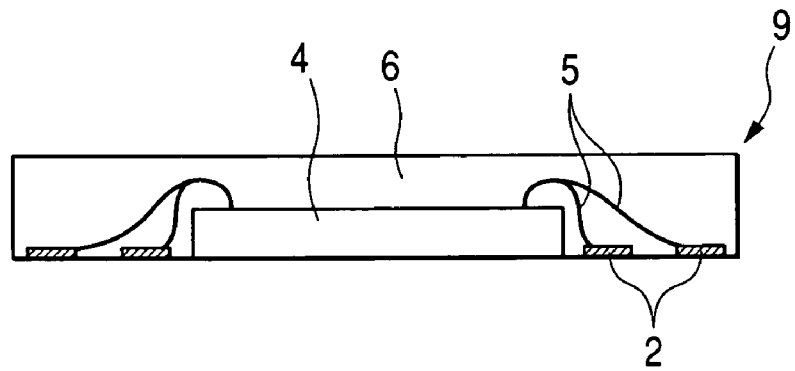
FIG. 28 is a schematic sectional view of a semiconductor device according to a still further embodiment (fourth embodiment) of the present invention.
Figure 29:
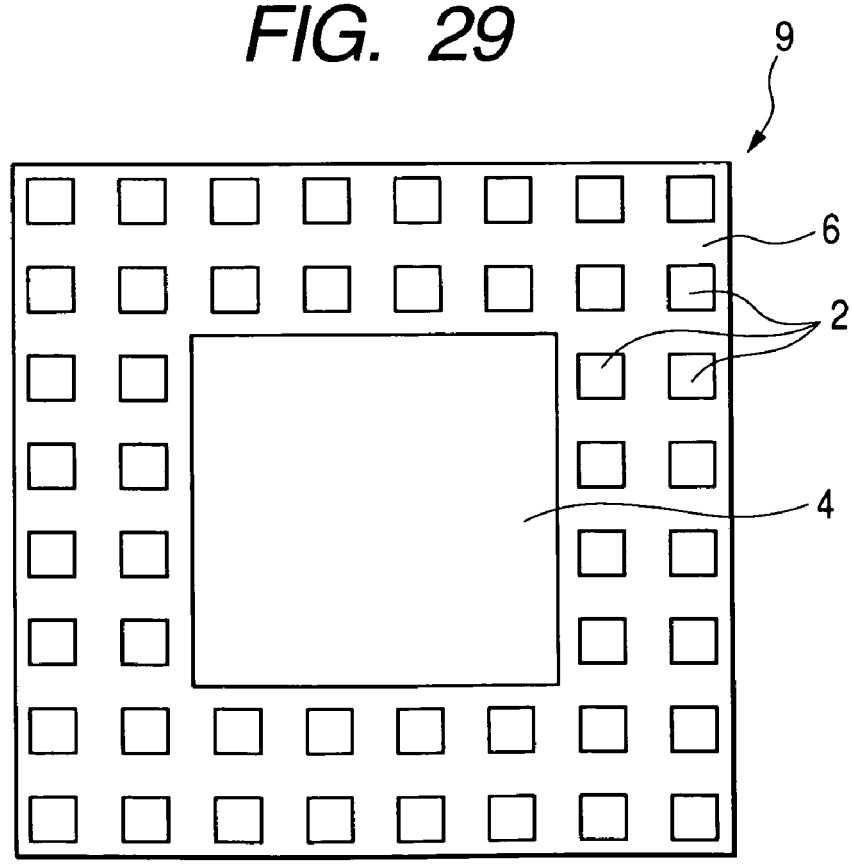
FIG. 29 is a schematic bottom view thereof.
Figure 30:
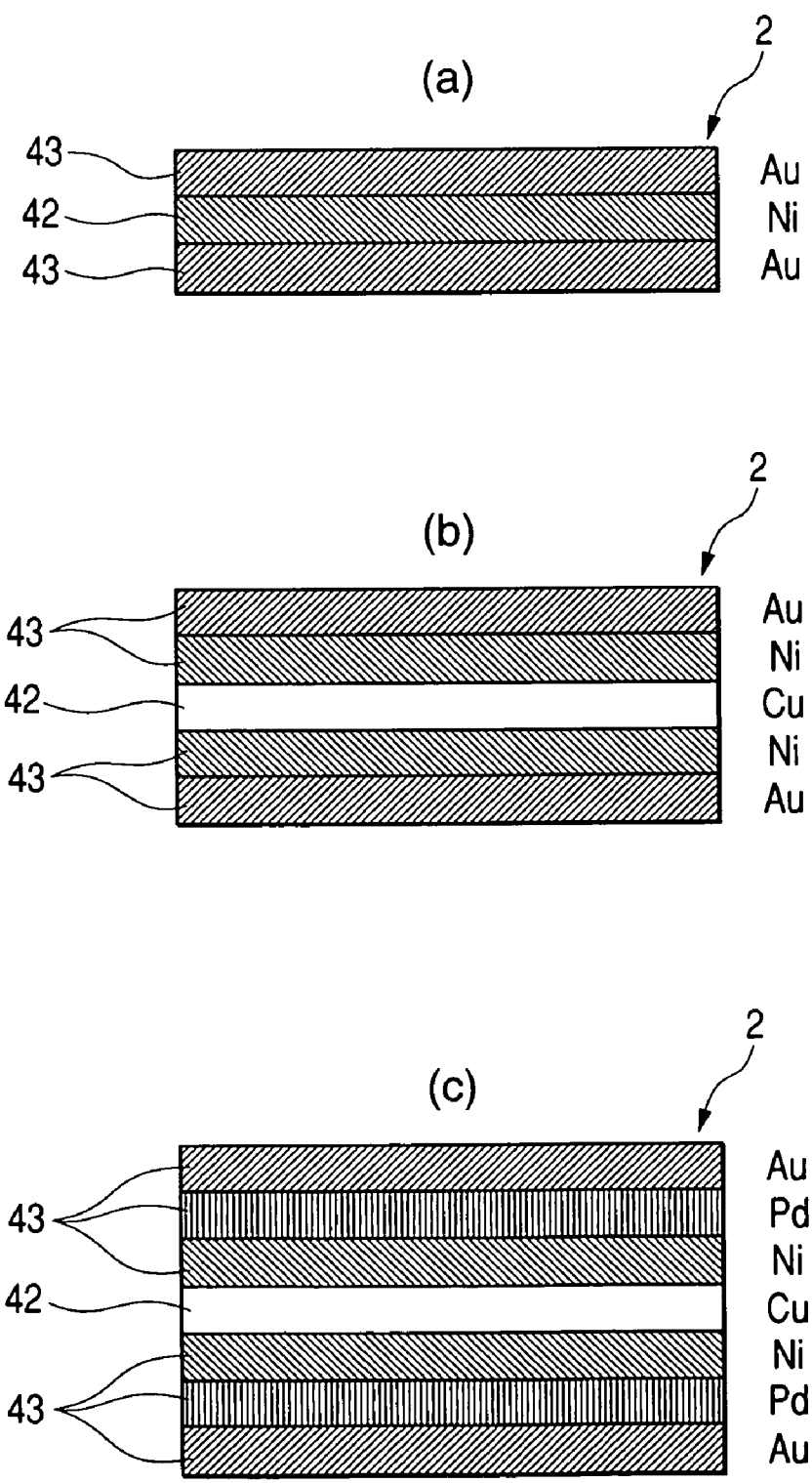
FIG. 30a-c is a schematic sectional view showing examples of terminals in the semiconductor device of the fourth embodiment.
Figure 31:
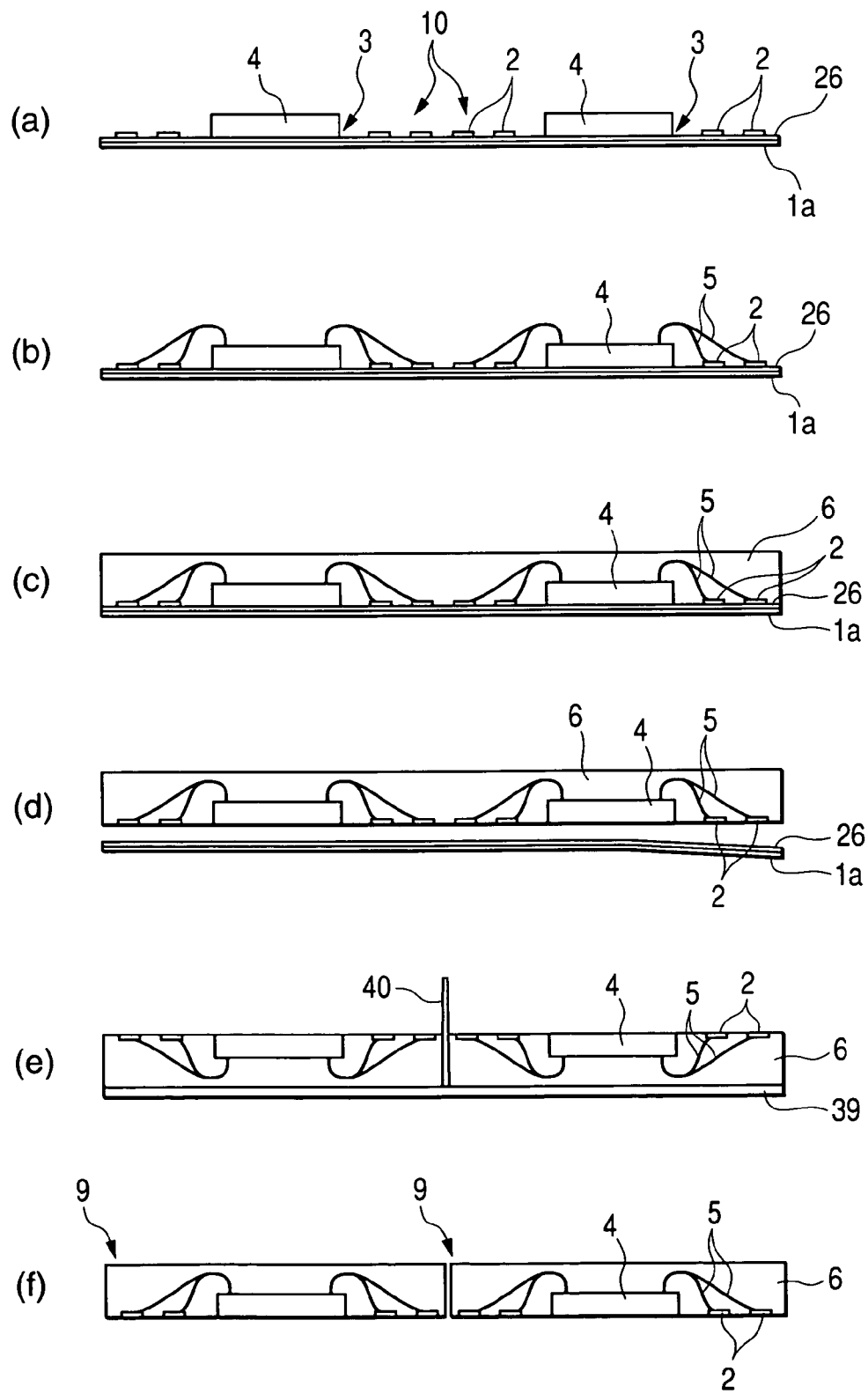
FIG. 31a-f is a schematic sectional view showing manufacturing steps in a method of manufacturing the semiconductor device of the fourth embodiment.

FIGS. 28 to 34 are related to a semiconductor device according to a still further embodiment (fourth embodiment) of the present invention, of which FIGS. 28 to 30 illustrate the structure of the semiconductor device and FIG. 31 illustrates a method of manufacturing the semiconductor device.

In the semiconductor device 9 of this fourth embodiment, as shown in FIGS. 28 and 29, back surfaces of an insulating resin layer 6, a semiconductor element 4 and terminals 2 are flush with each other, and the back surfaces of the semiconductor element 4 and terminals 2 are exposed from the insulating resin layer 6.

In this fourth embodiment, the structure of the terminals 2 is different from those in the previous embodiments. FIGS. 30(a) to 30(c) are schematic sectional views showing examples of terminals. As shown in FIGS. 30(a) to 30(c), each terminal 2 comprises a main metal layer 42 and one or plural auxiliary metal layers 43 formed on each of a surface and a back surface of the main metal layer 42.

FIG. 30(a) shows a first example of a terminal. This terminal 2 comprises a main metal layer 42 formed of Ni and an auxiliary metal layer 43 formed of Au. This structure is obtained, for example, by plating Ni foil to form Au plating film on each of a surface and a back surface of the Ni foil, then affixing the Ni foil to a tape 1a and etching the Ni foil into a predetermined pattern. By forming Au layers respectively on a main surface and a back surface of the terminal 2, Au wire can be connected to the main surface of the terminal 2, and a bonding material for packaging such as solder can be bonded to the back surface of the terminal 2.

FIG. 30(b) shows a second example of a terminal. This terminal 2 comprises a main metal layer 42 formed of Cu and two auxiliary metal layers 43 formed on each of a surface and a back surface of the main metal layer. Of the two layers, the lower layer is formed of Ni and the upper layer (surface layer) is formed of Au. The Ni layer is not only superior in its adhesiveness to CU but also prevents the diffusion of Au and Cu. The terminal 2 of this second example is obtained by plating copper foil twice to form Ni plating film and Au plating film on each of a surface and a back surface of the Cu foil, then affixing the copper foil to the tape 1a and etching the Ni foil into a predetermined pattern.

FIG. 30(c) shows a third example of a terminal. This terminal 2 comprises a main metal layer 42 formed of Cu and three auxiliary layers 43 formed on each of a surface and a back surface of the main metal layer. Of the three layers, the lower, intermediate and upper (surface) layers are formed of Ni, Pd and Au, respectively. The terminal 2 of this third example is obtained by plating copper foil three times to form Ni, Pd and Au plating films on each of a surface and a back surface of the copper foil, then affixing the copper foil to the tape 1a and etching the Ni foil into a predetermined pattern.

Since the surface of the Pd layer becomes rough, the surface of the Au layer also becomes rough unless the Au layer is formed thicker than necessary, with the result that the surface and the back surface of the terminal 2 also become rough. By making the main surface of the terminal 2 rough, the area of adhesion to the resin which constitutes the insulating resin layer 6 increases and the bonding force increases because the resin bites into the rough surface, so that the terminal 2 becomes difficult to fall off from the insulating resin layer 6 and the reliability of the semiconductor device becomes higher.

In all of the terminals fabricated in the above examples, the connection of Au wire is good and the adhesiveness of the bonding material in packaging is improved.

Next, a method of manufacturing the semiconductor device of this fourth embodiment will be described with reference to FIGS. 31(a) to 31(f). First, as shown in FIG. 31(a), a tape 1a is provided. On the tape 1a there are formed product forming portions 10 in a matrix shape. In each of the product forming portions 10, terminals 2 are arranged in two rows in the shape of a frame. A quadrangular portion inside the frame serves as a semiconductor element fixing portion 3.

Then, a semiconductor element 4 is fixed onto the semiconductor element fixing portion 3 in each of the product forming portions 10 with use of an adhesive 26 [see FIG. 31(a)].

Next, in each product forming portion 10, electrodes (not shown) on the semiconductor element 4 and the terminals 2 are connected together through wires 5 (Au wires) [see FIG. 31(b)].

Then, as shown in FIG. 31(c), an insulating resin layer 6 is formed on a main surface side of the tape 1a by one-side molding in transfer molding to cover the semiconductor element 4 and wires 5.

Next, as shown in FIG. 31(d), the tape 1a is peeled from a back surface of the insulating resin layer 6. At this time, an adhesive 26 on the main surface of the tape 1a is peeled from the back surface of the insulating resin layer 6, so that back surfaces of the terminals 2 and the semiconductor element 4 are exposed to the back surface of the insulating resin layer 6. The back surfaces of the insulating resin layer 6, the semiconductor element 4 and the terminals 2 come to be positioned on the same plane, and the back surfaces of the semiconductor element 4 and the terminals 2 are exposed from the insulating resin layer 6.

Then, as shown in FIG. 31(e), a support member (adhesive tape) 39 affixed to a support frame (not shown) is affixed to a main surface of the insulating resin layer 6 and the product forming portions are cut from the back surface of the insulating resin layer 6 up to an intermediate depth of the adhesive tape 39 along boundaries of the product forming portions by means of a dicing blade 40 to divide the product forming portions into individual product forming portions, thereby affording semiconductor devices 9. The semiconductor devices 9 thus separated are in an affixed state to the adhesive tape 39. By removing (peeling) the individual semiconductor devices 9 from the adhesive tape 39, there are fabricated plural such semiconductor devices 9 as shown in FIG. 31(f).

Figure 32:
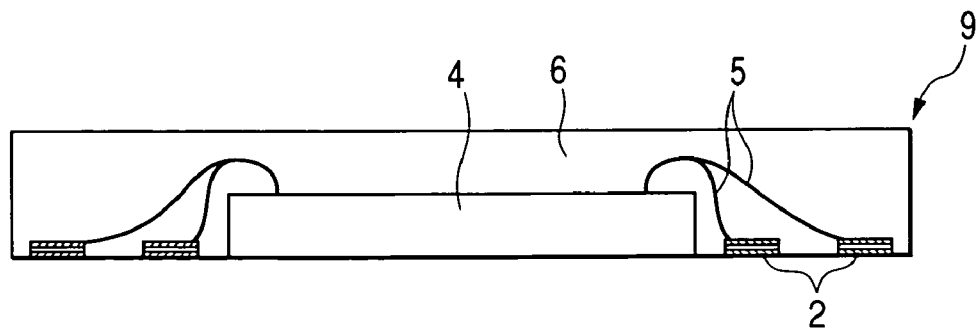
FIG. 32 is a schematic sectional view of a semiconductor device having circular terminals and manufactured by the method of manufacturing the semiconductor device of the fourth embodiment.
Figure 33:
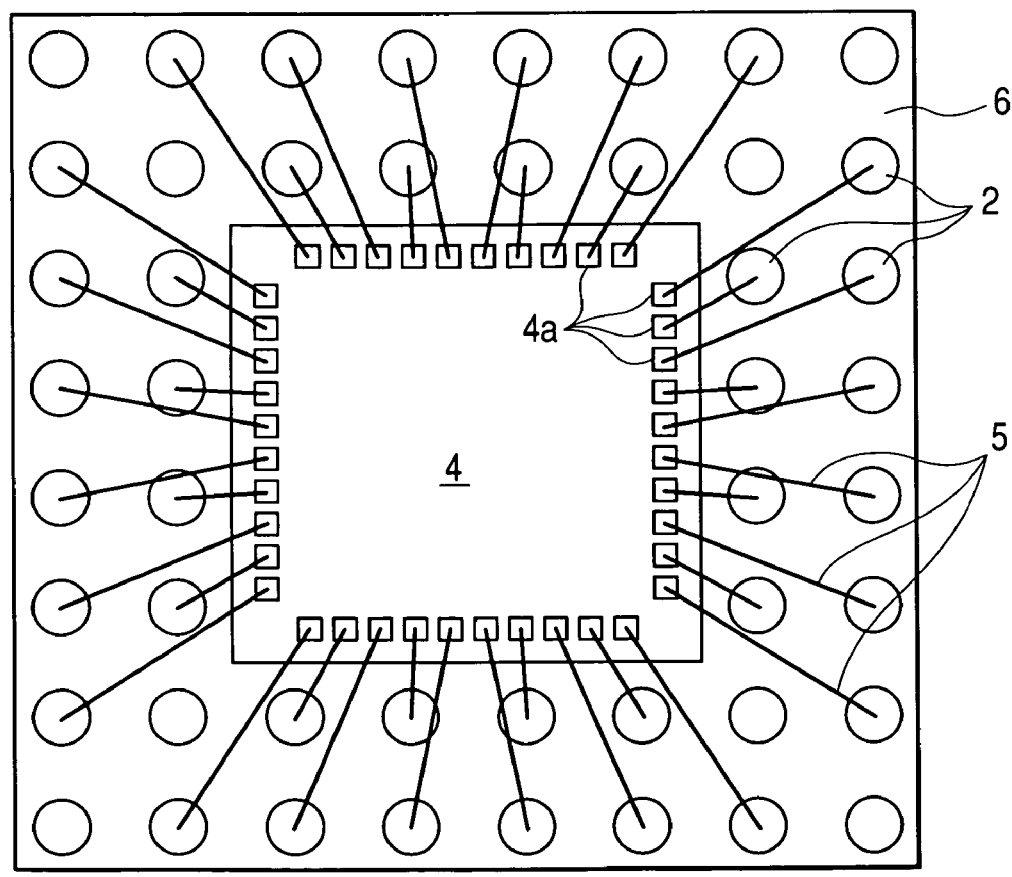
FIG. 33 is a schematic perspective plan view thereof.
Figure 34:
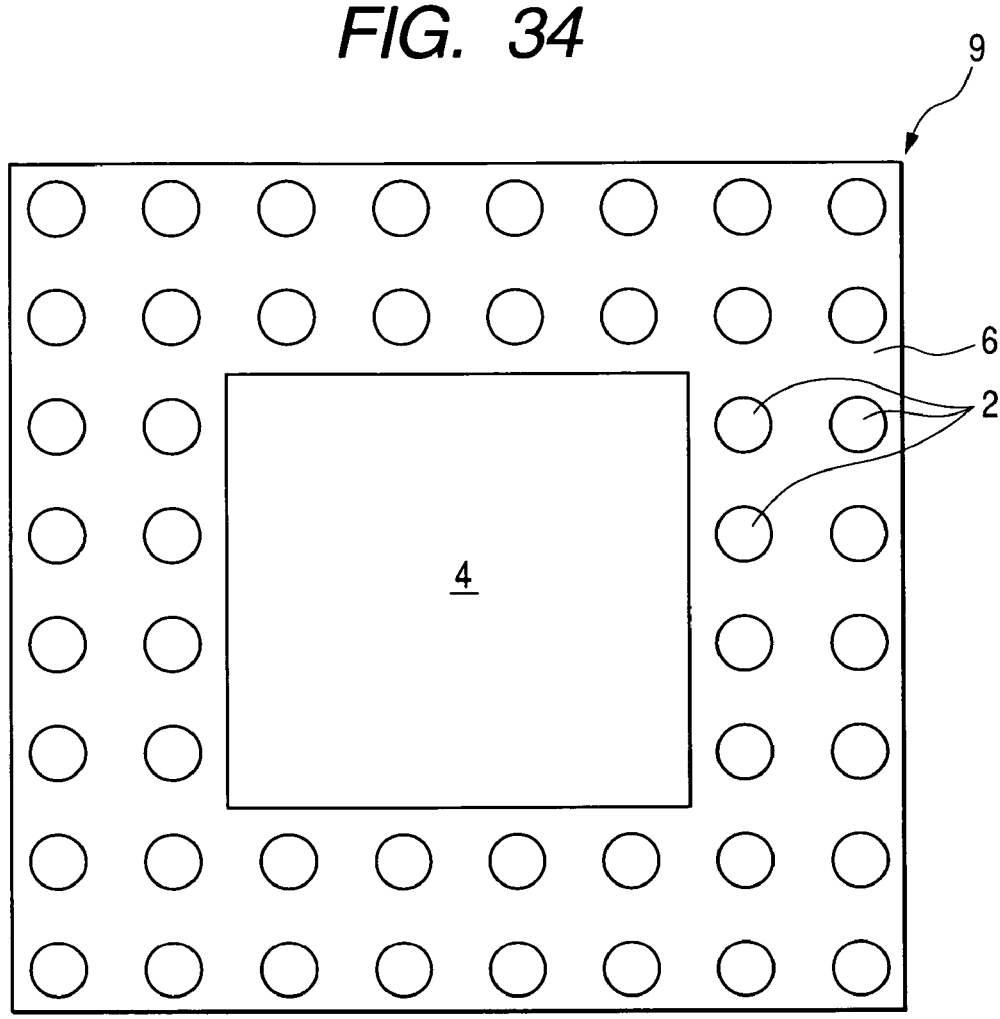
FIG. 34 is a schematic bottom view thereof.

FIGS. 32 to 34 are related to a semiconductor device manufactured by the semiconductor device manufacturing method according to claim 4, of which FIG. 32 is a schematic perspective plan view of the semiconductor device, FIG. 33 is a schematic perspective plan view thereof, and FIG. 34 is a schematic bottom view thereof. Even if the shape of each terminal 2 is any other shape than the quadrangular shape, some of the effects described in the previous embodiments will be obtained.

According to this fourth embodiment it is possible to fabricate a surface mounted type non-leaded semiconductor device.

Fifth Embodiment

Figure 35:
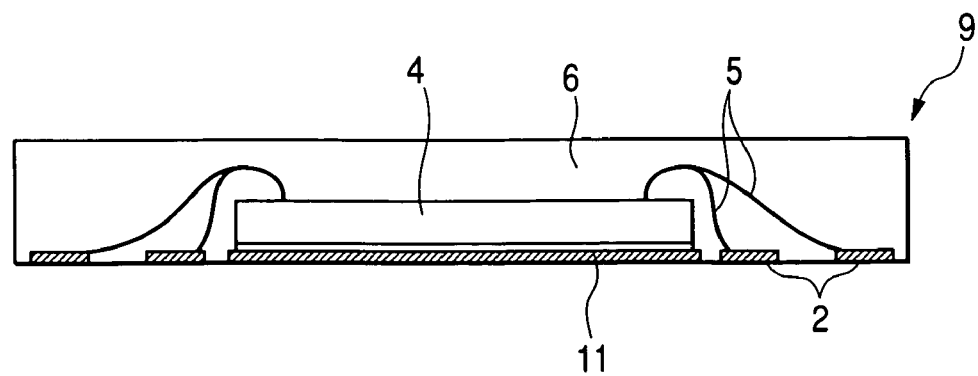
FIG. 35 is a schematic sectional view of a semiconductor device according to a still further embodiment (fifth embodiment) of the present invention.
Figure 36:
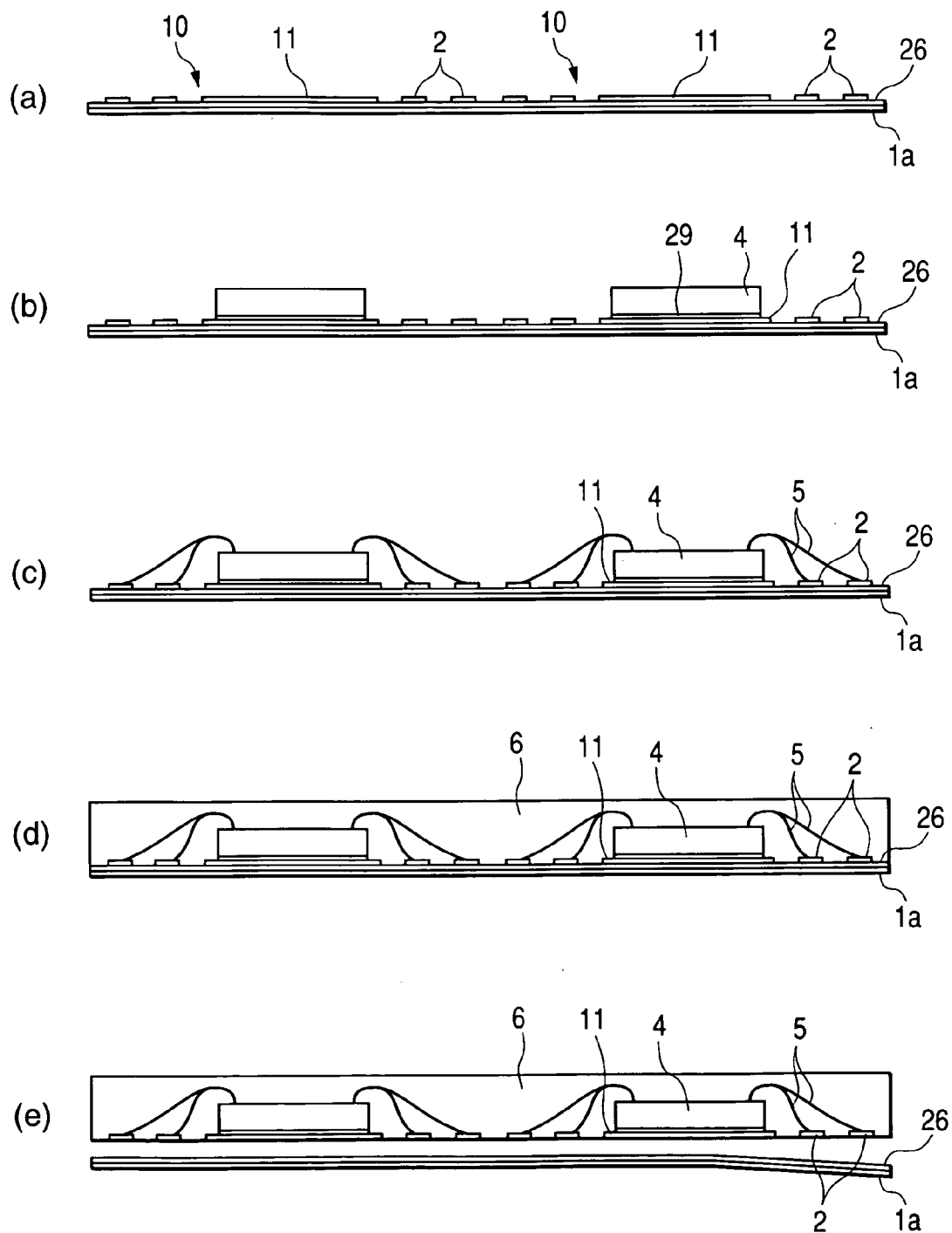
FIG. 36a-e is a schematic sectional view showing manufacturing steps in a method of manufacturing the semiconductor device of the fifth embodiment.
Figure 37:
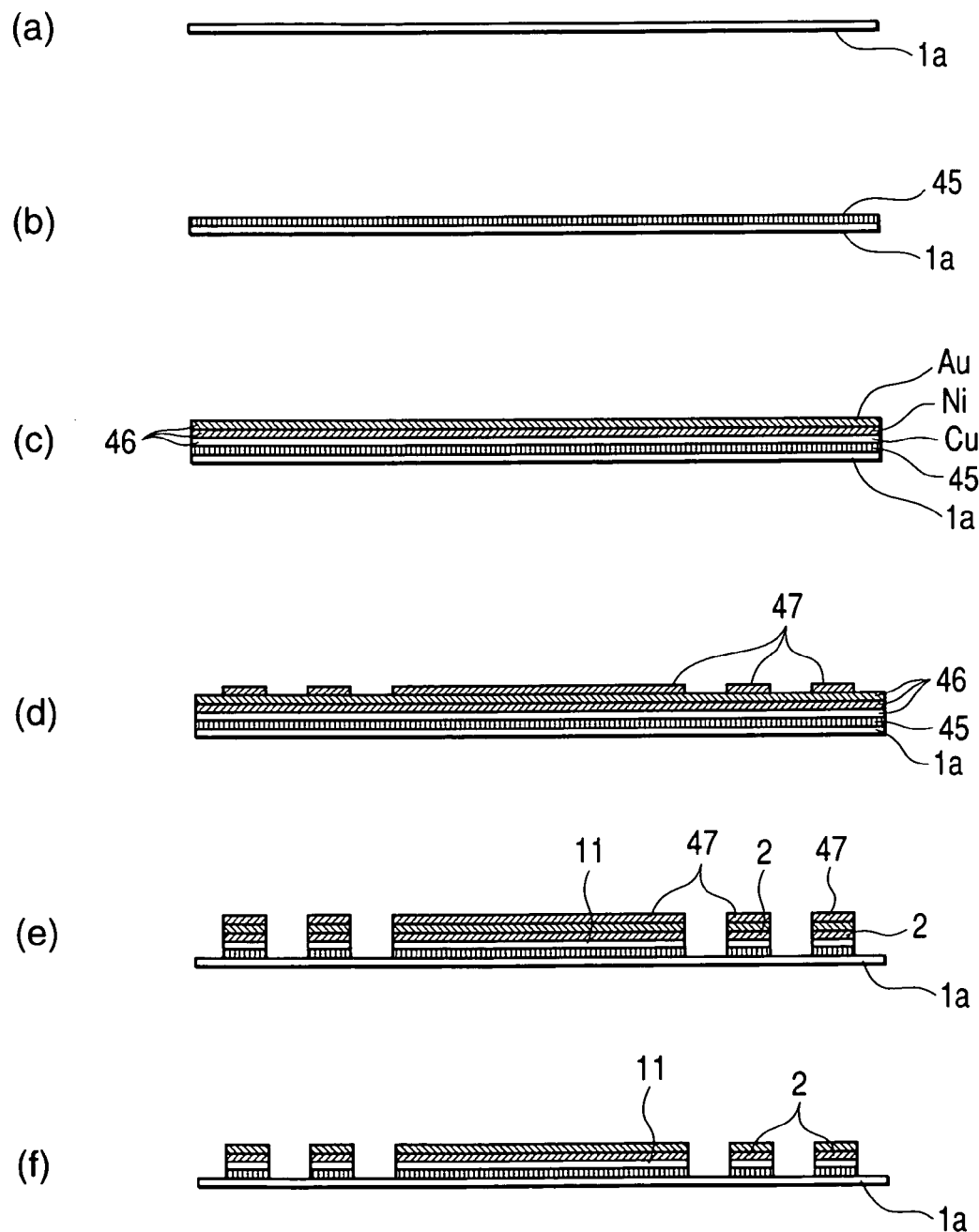
FIG. 37a-f is a schematic sectional view of manufacturing steps, showing an example of fabricating a terminals-arranged tape used in the method of manufacturing the semiconductor device of the fifth embodiment.

FIGS. 35 to 37 are related to a semiconductor device according to a still further embodiment (fifth embodiment) of the present invention, of which FIG. 35 is a schematic sectional view of the semiconductor device and FIG. 36 is a schematic sectional view showing manufacturing steps in a method of manufacturing the semiconductor device according to the fifth embodiment.

In the semiconductor device 9 of this fifth embodiment, as shown in FIG. 35, a semiconductor element 4 sealed within an insulating resin layer 6 is supported by a single semiconductor element fixing piece 11, and a back surface of the semiconductor element fixing piece 11 and that of the insulating resin layer 6 are positioned on the same plane. Back surfaces of terminals 2 are also flush with the back surface of the insulating resin layer 6. Though not shown in the drawing, the terminals 2 and the semiconductor element fixing piece 11 each comprise a main metal layer and one or plural auxiliary metal layers formed on each of a surface and a back surface thereof, with the auxiliary metal layer positioned as a surface layer being Au layer.

The semiconductor device 9 of this fifth embodiment is manufactured in accordance with the manufacturing steps shown in the sectional views of FIGS. 36(a) to 36(e).

First, such a tape 1a as shown in FIG. 36(a) is provided. The tape 1a has product forming portions 10 arranged in a matrix form. In each of the product forming portions 10, terminals 2 are arranged in two rows in the shape of a frame. A semiconductor element fixing piece 11 of a quadrangular shape is provided inside the frame. The terminals 2 and the semiconductor element fixing piece 11 are bonded together through an adhesive 26.

As the tape 1a there may be used the tape which has been used in the previous fourth embodiment. Now, with reference to FIGS. 37(a) to 37(f), a description will be given of another tape fabrication example.

After the tape 1a is provided as shown in FIG. 37(a), a metal film 45 is formed on a main surface of the tape 1a by, for example, vapor deposition or sputtering. The metal of the metal film 45 is not specially limited insofar as it can be formed by vapor deposition or sputtering. For example, the metal film 45 is formed using any of Ag, Au, Al, Cu, Ni, Pd, and Cr.

Next, as shown in FIG. 37(c) one or plural auxiliary metal layers 46 are formed on a main surface of the metal film 45 by an electrolytic plating method. For example, Cu, Ni, and Au are plated in this order onto the main surface of the metal film 45.

Then, as shown in FIG. 37(d), a photoresist film 47 is formed in a predetermined pattern on the auxiliary metal layer 46 positioned as a surface layer. Thereafter, as shown in FIG. 37(e), using the photoresist film 47 as a mask for etching, the auxiliary metal layers 46 and the metal film 45 are etched to form terminals 2 and a semiconductor element fixing piece 11. Further, by removing the photoresist film 47, the tape 1a having the semiconductor element fixing piece 11 and the terminals 2 on the main surface thereof is fabricated as shown in FIG. 37(f).

In the fifth embodiment, such a tape 1a or the tape 1a used in the previous fourth embodiment is used in manufacturing the semiconductor device.

After the tape 1a is provided as shown in FIG. 36(a), a semiconductor element 4 is fixed onto the semiconductor element fixing piece 11 through an adhesive (second adhesive) 29, as shown in FIG. 36(b).

Next, electrodes (not shown) on the semiconductor element 4 and the terminals 2 are connected together through wires 5 (Au wires), as shown in FIG. 36(c).

Then, as shown in FIG. 36(d), an insulating resin layer 6 is formed on the main surface of the tape 1a by one-side molding in transfer molding to cover the semiconductor element 4 and the wires 5.

Next, as shown in FIG. 36(e), the tape 1a is peeled from a back surface of the insulating resin layer 6. At this time, the adhesive 26 on the main surface of the tape 1a is peeled from the back surface of the insulating resin layer 6, back surfaces of the terminals 2 and the semiconductor element 4 are exposed to the back surface of the insulating resin layer 6. The back surfaces of the insulating resin layer 6, the semiconductor element 4 and the terminals 2 come to be positioned on the same plane, and the back surfaces of the semiconductor element 4 and the terminals 2 are exposed from the insulating resin layer 6.

Thereafter, the insulating resin layer 6 is cut into individual product forming portions in the same manner as in the fourth embodiment to afford individual semiconductor devices 9.

According to this fifth embodiment there accrues the effect that it is possible to form wiring lines at a higher degree of freedom.

Sixth Embodiment

Figure 38:
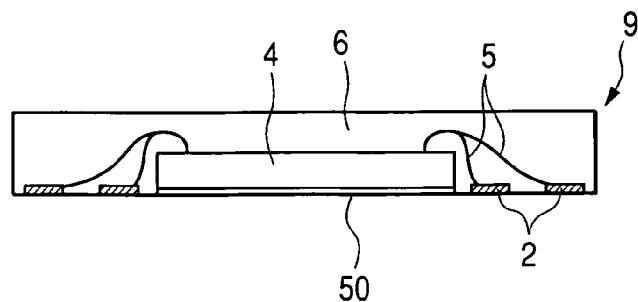
FIG. 38 is a schematic sectional view of a semiconductor device according to a still further embodiment (sixth embodiment) of the present invention.
Figure 39:
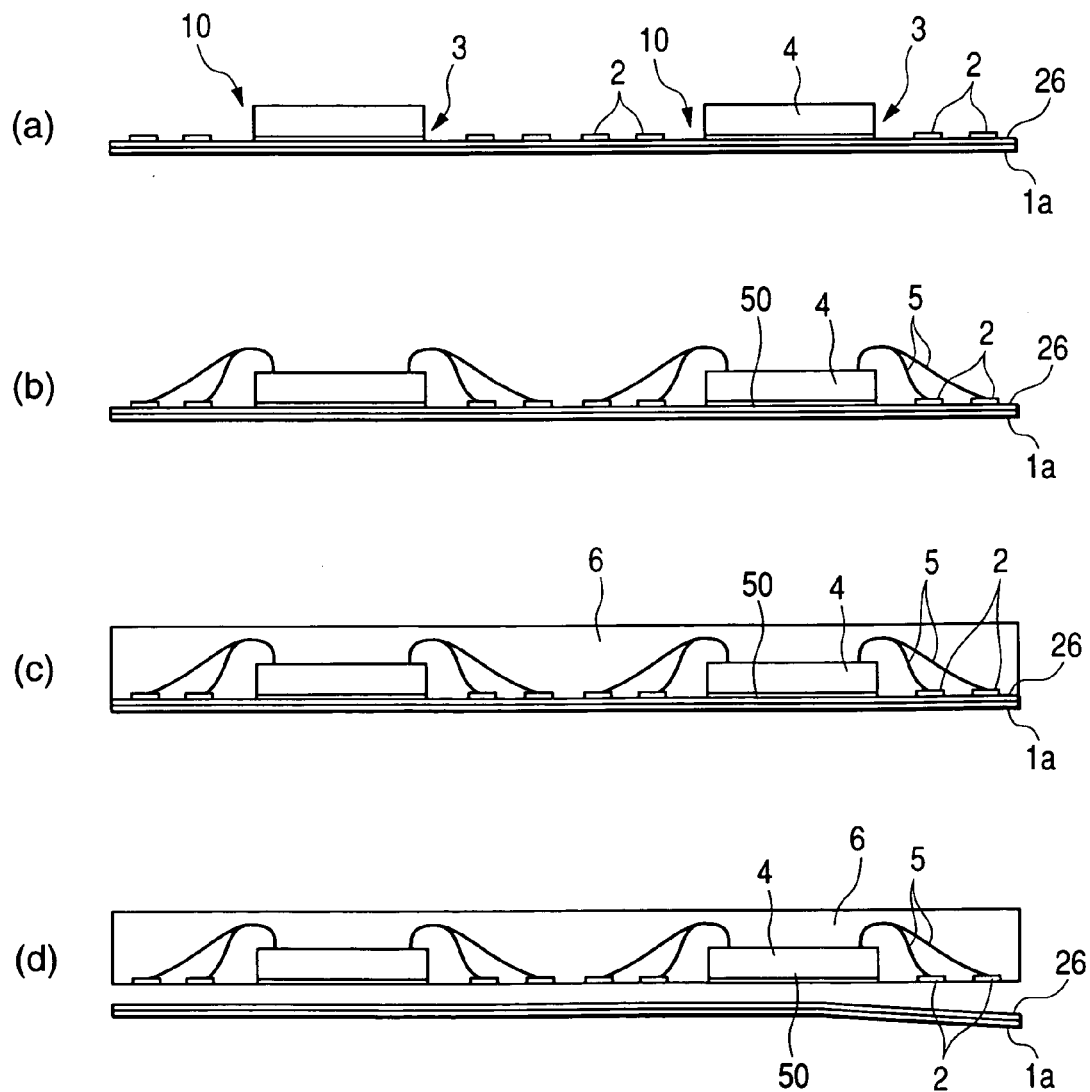
FIG. 39a-d is a schematic sectional view showing manufacturing steps in a method of manufacturing the semiconductor device of the sixth embodiment.

FIG. 38 is a schematic sectional view of a semiconductor device according to a still further embodiment (sixth embodiment) of the present invention and FIG. 39 is a schematic sectional view showing manufacturing steps in a method of manufacturing the semiconductor device.

An insulating adhesive 50 is allowed to remain on a back surface of a semiconductor element 4, thereby causing a silicon substrate of the semiconductor element 4 to be independent electrically. That is, peripheral faces of the semiconductor element 4 and the adhesive 50 are covered with an insulating resin (insulating resin layer 6), so that the silicon substrate of the semiconductor element 4 assumes an electrically independent state.

The adhesive 50 used is an insulating adhesive which is weaker in its adhesion to an adhesive (first adhesive) 26 for bonding a tape 1a and copper foil than in its adhesion to the silicon substrate of the semiconductor element 4. Therefore, when the tape 1a is peeled from the insulating resin layer 6, the adhesive 50 and the tape 1a (or the adhesive (first adhesive) 26) are peeled from each other in such a manner that the adhesive 50 remains on a back surface of the semiconductor element 4.

The adhesive 50 may be substituted by an adhesive tape both surfaces of which are adhesive surfaces. The adhesive which forms the adhesive surfaces is an insulating adhesive which is weaker in its adhesion to the adhesive (first adhesive) 26 for bonding the tape 1a and copper foil than in its adhesion to the semiconductor element 4 and the silicon substrate. Therefore, when the tape 1a is peeled from the insulating resin layer 6, the adhesive 50 and the tape 1a (or the adhesive (first adhesive) 26) are peeled from each other while allowing the insulating adhesive tape to remain on the back surface of the semiconductor element 4.

In the semiconductor device 9 of this sixth embodiment, the back surface of the semiconductor element 4 is not exposed to the back surface of the sealing member formed by the insulating resin layer 6, but is covered with the insulating adhesive 50, so that it is possible to ensure an electric insulation on the back side of the semiconductor element 4.

Next, the following description is provided about a method of manufacturing the semiconductor device 9 of this sixth embodiment. The tape 1a used in the fourth embodiment is used in this method.

As shown in FIG. 39(a), after the tape 1a is provided, a semiconductor element 4 is fixed through the insulating adhesive 50 to a semiconductor element fixing portion 3 in each product forming portion 10.

Next, as shown in FIG. 39(b), electrodes (not shown) on the semiconductor element 4 and terminals 2 are connected together through wires 5 (Au wires).

Then, as shown in FIG. 39(c), an insulating resin layer 6 is formed on a main surface of the tape 1a by one-side molding in transfer molding to cover the semiconductor element 4 and the wires 5.

Next, as shown in FIG. 39(d), the tape 1a is peeled from a back surface of the insulating resin layer 6. The peeling is done along the boundary between the adhesive (first adhesive) 26 and the adhesive 50. The tape 1a is peeled together with the adhesive 26. As a result of the tape 1a and the adhesive 26 having been peeled, back surfaces of the terminals 2 and the semiconductor element 4 are exposed to the back surface of the insulating resin layer 6. The back surfaces of the insulating resin layer 6, the semiconductor element 4 and the terminals 2 come to be exposed on the same plane, and the back surfaces of the semiconductor element 4 and the terminals 2 are exposed from the insulating resin layer 6. The exposed surfaces of the terminals 2 have Au layer for satisfactory bonding to an adhesive at the time of packaging the semiconductor device.

Thereafter, the insulating resin layer 6 is divided into individual product forming portions in the same way as in the fourth embodiment to fabricate such plural semiconductor devices 9 as shown in FIG. 38.

Seventh Embodiment

Figure 40:
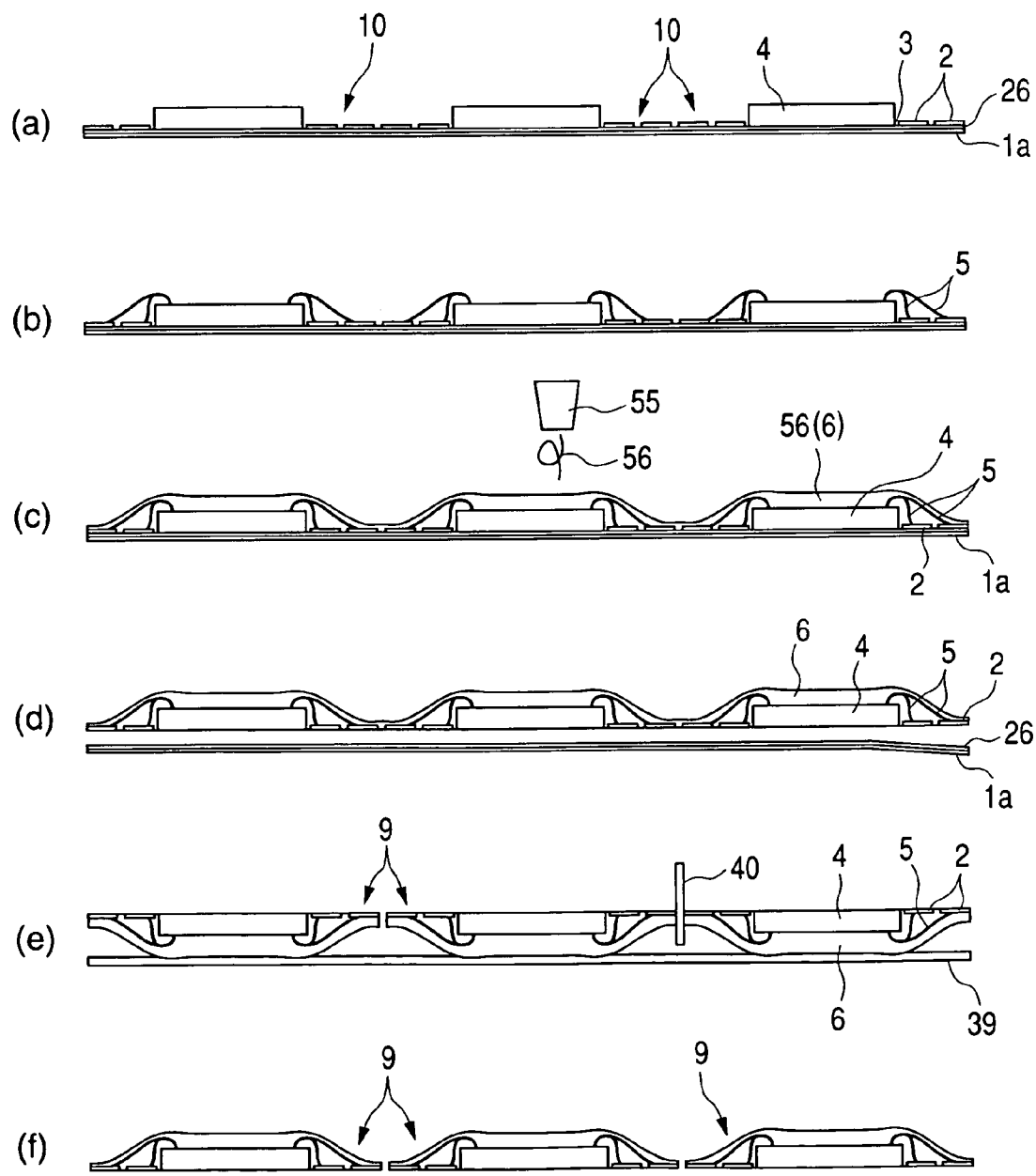
FIG. 40a-f is a schematic sectional view showing manufacturing steps in a method of manufacturing a semiconductor device according to a still further embodiment (seventh embodiment) of the present invention.

FIG. 40 is a sectional view showing manufacturing steps in a method of manufacturing a semiconductor device according to a still further embodiment (seventh embodiment) of the present invention.

In this seventh embodiment, an insulating resin layer 6 is formed by potting. Materials to be provided and other steps than the potting step are the same as in the fourth embodiment. First, as shown in FIG. 40(a), a tape 1a is provided. The tape 1a has product forming portions 10 formed in a matrix shape on a main surface of the tape.

Terminals 2 are bonded to the tape 1a through an adhesive 26 and surfaces thereof have Au layer.

Next, as shown in FIG. 40(a), a semiconductor element 4 is fixed through the adhesive 26 onto a semiconductor element fixing portion 3 located inside framewise-arranged terminals 2 in each of the product forming portions 10.

Then, in each of the product forming portions 10, electrodes (not shown) on the semiconductor element and the terminals 2 are connected together through wires 5 (Au wires) [see FIG. 40(b)].

Next, as shown in FIG. 40(c), an insulating sealing resin 56 is dropwise added from a dispenser 55 to form an insulating resin layer 6 on the main surface of the tape 1a. The semiconductor element 4 and the wires 5 are covered with the insulating resin layer 6. The sealing resin 56 has fluidity and therefore becomes high over the semiconductor element 4 and low over the terminals 2. However, since the insulating resin 56 possesses a predetermined fluidity, it surely covers the semiconductor element 4 and the wires 5. After the dropwise addition of the sealing resin 56, the resin is cured to form a cured insulating resin layer 6.

Then, as shown in FIG. 40(d), the tape 1a is peeled from a back surface of the insulating resin layer 6. At this time, the adhesive 26 on the main surface of the tape 1a is peeled from the back surface of the insulating resin layer 6, so that back surfaces of the terminals 2 and the semiconductor element 4 are exposed to the back surface of the insulating resin layer 6. The back surfaces of the insulating resin layer 6, the semiconductor element 4 and the terminals 2 come to be positioned on the same plane, and the back surfaces of the semiconductor element 4 and the terminals 2 are exposed from the insulating resin layer 6.

Next, as shown in FIG. 40(e), a support member (adhesive tape) 39 affixed to a support frame (not shown) is affixed to a main surface of the insulating resin layer 6, and the insulating resin layer 6 is cut along boundaries of the product forming portions into individual product forming portions by means of a dicing blade 40 to afford semiconductor devices 9. The thus-separated semiconductor devices 9 are in an affixed state to the adhesive tape 39. By removing (peeling) the semiconductor devices 9 from the adhesive tape 39 there are obtained such plural individual semiconductor devices 9 as shown in FIG. 40(f).

According to this seventh embodiment, since the sealing member of resin is formed by potting, (1) it is not necessary to use a molding die, (2) the occurrence of a short-circuit caused by wire shift in molding can be diminished, (3) chip shrink becomes possible because of narrowing of the pad pitch with improvement of the wire short margin, and (4) a further reduction of package thickness can be attained.

Eighth Embodiment

FIGS. 41 to 46 are related to a semiconductor device according to a still further embodiment (eighth embodiment) of the present invention. This eighth embodiment relates to a structure wherein plural semiconductor elements are incorporated within the semiconductor device.

Figure 41:
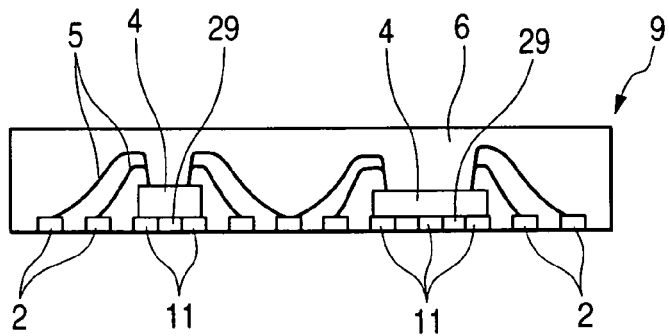
FIG. 41 is a schematic sectional view of a semiconductor device according to a still further embodiment (eighth embodiment) of the present invention.

In the semiconductor device 9 of this eighth embodiment, as shown in a schematic sectional view of FIG. 41, semiconductor elements 4 are mounted on plural semiconductor element fixing pieces 11 at plural positions.

Figure 42:
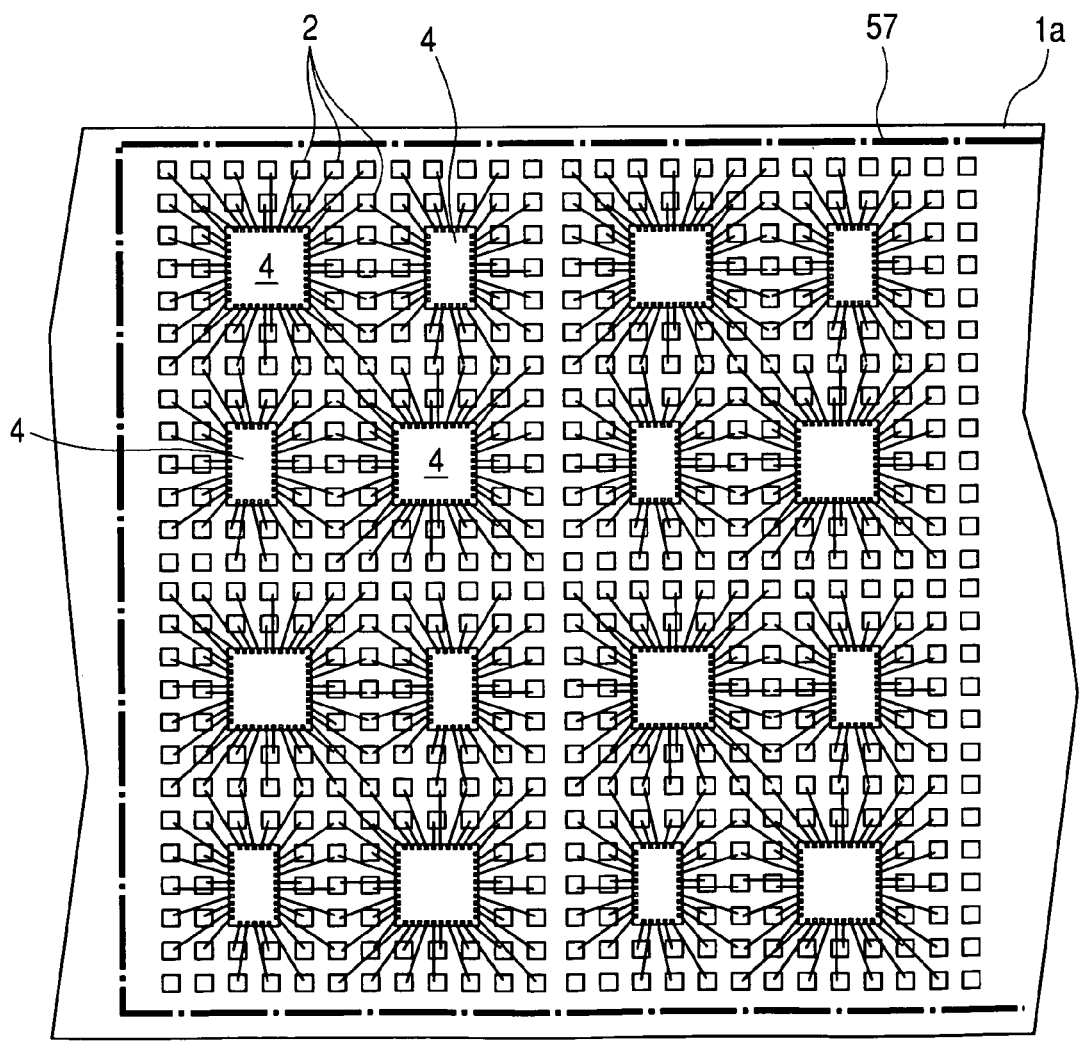
FIG. 42 is a schematic plan view of a terminals-arranged tape after chip bonding and wire bonding in a method of manufacturing the semiconductor device of the eighth embodiment.

In a method of manufacturing the semiconductor device 8 according to this eighth embodiment, there is used such a tape 1a as shown in FIG. 42. In FIG. 42, a total of four product forming portions are formed longitudinally and transversely though not indicated by reference numerals. Four types of semiconductor elements 4 are fixed to predetermined positions in each product forming portion, and electrodes on each semiconductor element 4 and terminals 2 are connected together through wires 5. In the same figure, reference numerals are affixed to only one product forming portion, and a partial region surrounded with a dot-dash line is a molding region 57 in transfer molding.

Figure 43:
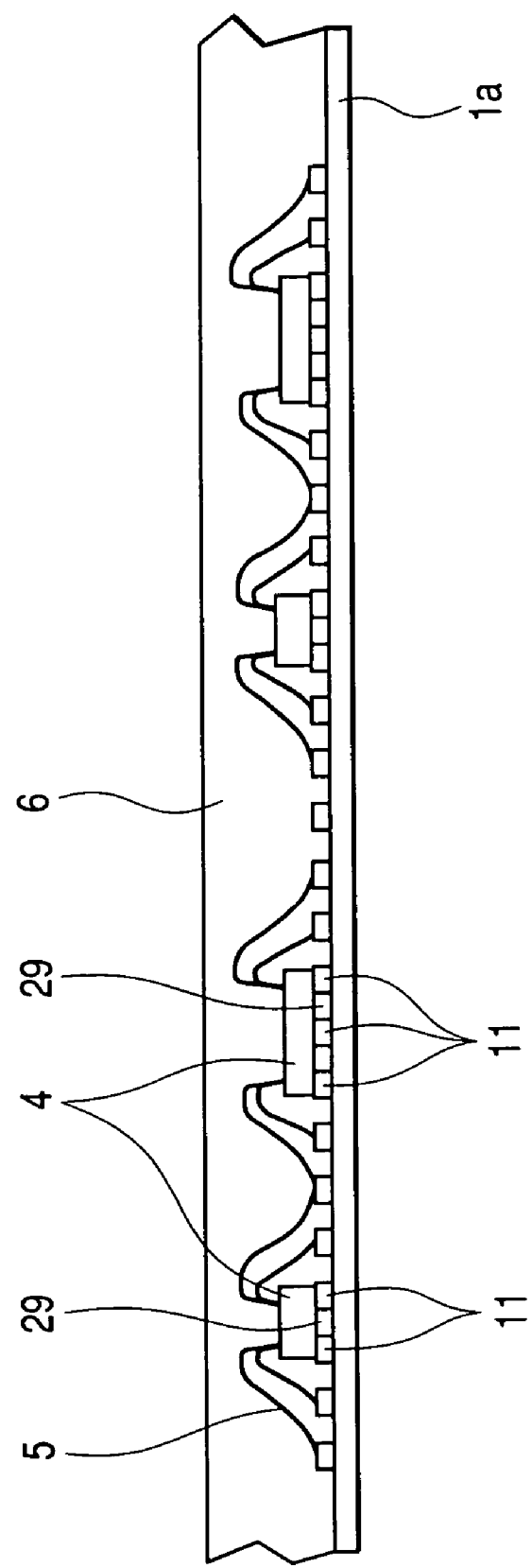
FIG. 43 is a schematic sectional view of the terminals-arranged tape with an insulating resin layer formed thereon in the method of manufacturing the semiconductor device of the eighth embodiment.
Figure 44:
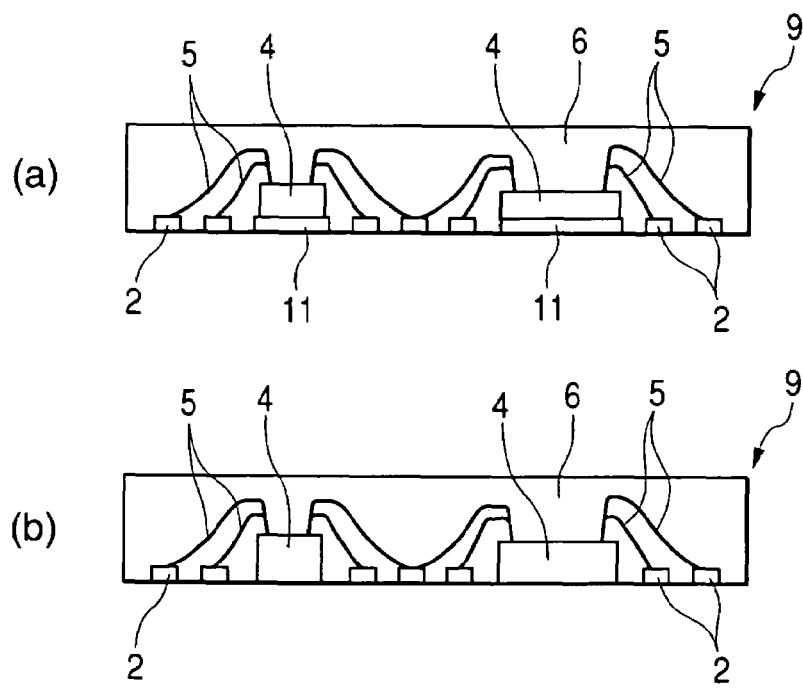
FIG. 44a-b is a schematic sectional view of semiconductor devices manufactured by using other terminals-arranged tapes in the method of manufacturing the semiconductor device of the eighth embodiment.

FIG. 43 is a schematic sectional view of the tape 1a which is a terminals-arranged tape with an insulating resin layer 6 formed thereon and which is used in this semiconductor device manufacturing method. All the semiconductor elements 4 and wires 5 are covered with the insulating resin layer 6.

In steps which follow this molding step, the tape 1a having thus been subjected to molding is peeled from the insulating resin layer 6 in the same way as in the previous embodiments and thereafter the insulating resin layer 6 is cut longitudinally and transversely into a plurality of individual semiconductor devices 9.

FIGS. 44(a) and 44(b) are schematic sectional views of semiconductor devices manufactured by using other terminals-arranged tapes. In the semiconductor device 9 shown in FIG. 44(a), semiconductor elements 4 are each mounted on a single semiconductor element fixing piece 11, while in the semiconductor device 9 shown in FIG. 44(b), semiconductor elements 4 are fixed onto a main surface of a tape 1a. Thus, various tapes are employable.

Figure 45:
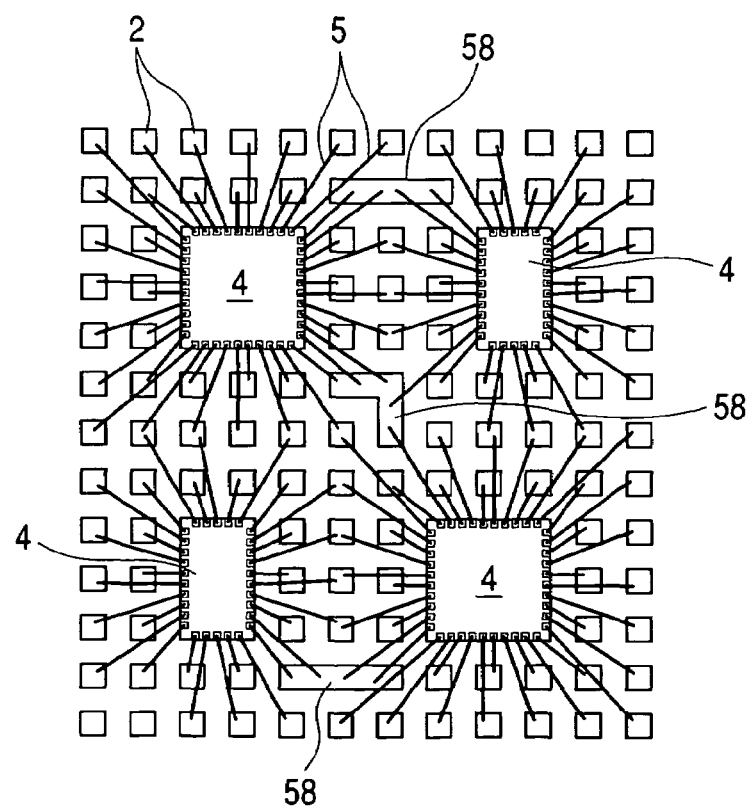
FIG. 45 is a schematic plan view showing a manufacturing example using a terminals-arranged tape having wiring distribution terminals in the method of manufacturing the semiconductor device of the eighth embodiment.

In the semiconductor device manufacturing method according to this eight embodiment, as shown in FIG. 45, if adjacent terminals are made integrally contiguous to each other to form a wiring distribution terminal 58, there accrues the effect that a distributive connection of wires 5 becomes easier. Moreover, if there is adopted a structure wherein the semiconductor elements are fixed using an insulating adhesive, the wiring distribution terminal 58 can be positioned below the semiconductor elements, whereby the degree of freedom in product design becomes higher.

Figure 46:
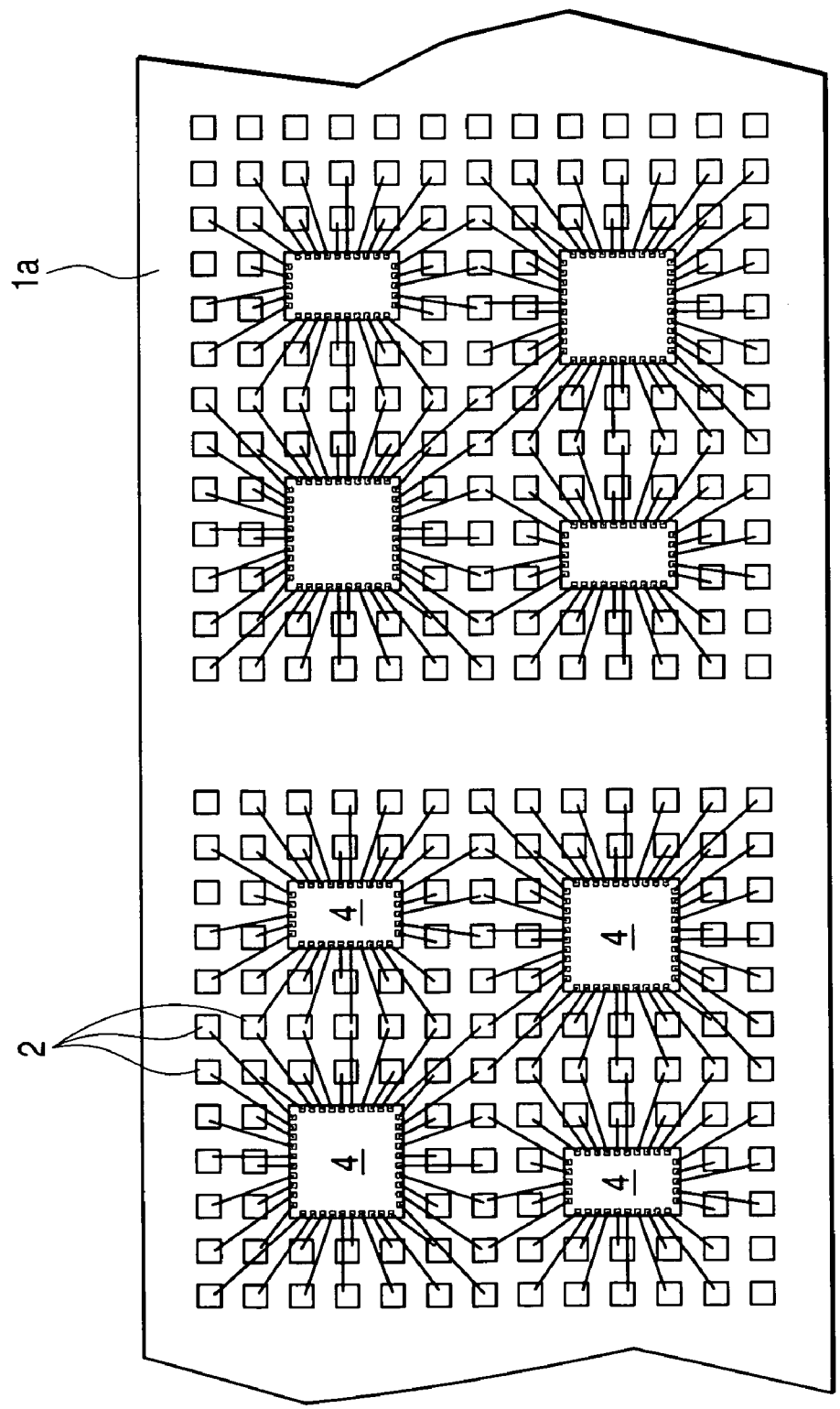
FIG. 46 is a schematic plan view showing an example of manufacturing semiconductor devices in a row on a terminals-arranged tape in the method of manufacturing the semiconductor device of the eighth embodiment.

Although in this embodiment reference has been made to the technique of manufacturing the semiconductor devices 9 with use of the tape 1a on which product forming portions are arranged in a matrix form, product forming portions may be arranged in one row to manufacture the semiconductor devices in one row on the tape 1a, as shown in FIG. 46.

According to this eighth embodiment, by incorporating plural chips (semiconductor elements) in each semiconductor device 9, there can be manufactured a thin and small-sized semiconductor device 9 in a less expensive manner.

Ninth Embodiment

FIGS. 47 to 51 are related to a semiconductor device according to a still further embodiment (ninth embodiment) of the present invention. Also in this ninth embodiment, as in the eighth embodiment, plural semiconductor elements are incorporated within a semiconductor device. Semiconductor elements are stacked on at least some semiconductor elements. In this ninth embodiment, all of semiconductor elements 4 used are stacked in two stages.

Figure 47:
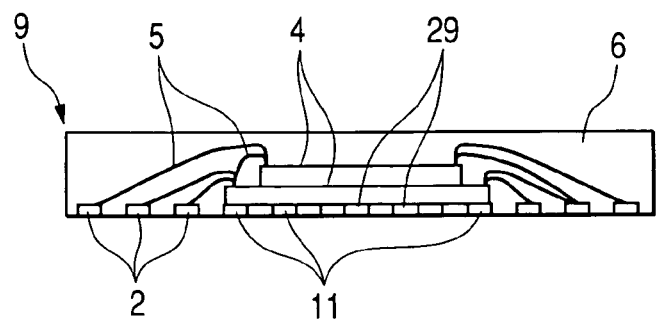
FIG. 47 is a schematic sectional view of a semiconductor device according to a still further embodiment (ninth embodiment) of the present invention.

In the semiconductor device 9 according to this ninth embodiment, as shown in a schematic sectional view of FIG. 47, on a semiconductor element 4 fixed onto plural semiconductor element fixing pieces 11 there is mounted another semiconductor element 4 of a smaller size. Electrodes (not shown) on the lower semiconductor element 4 are not covered with the upper semiconductor element 4, but are exposed so as not to obstruct wire bonding. Electrodes and terminals 2 on both lower and upper semiconductor elements 4 are connected together through wires 5.

Figure 48:
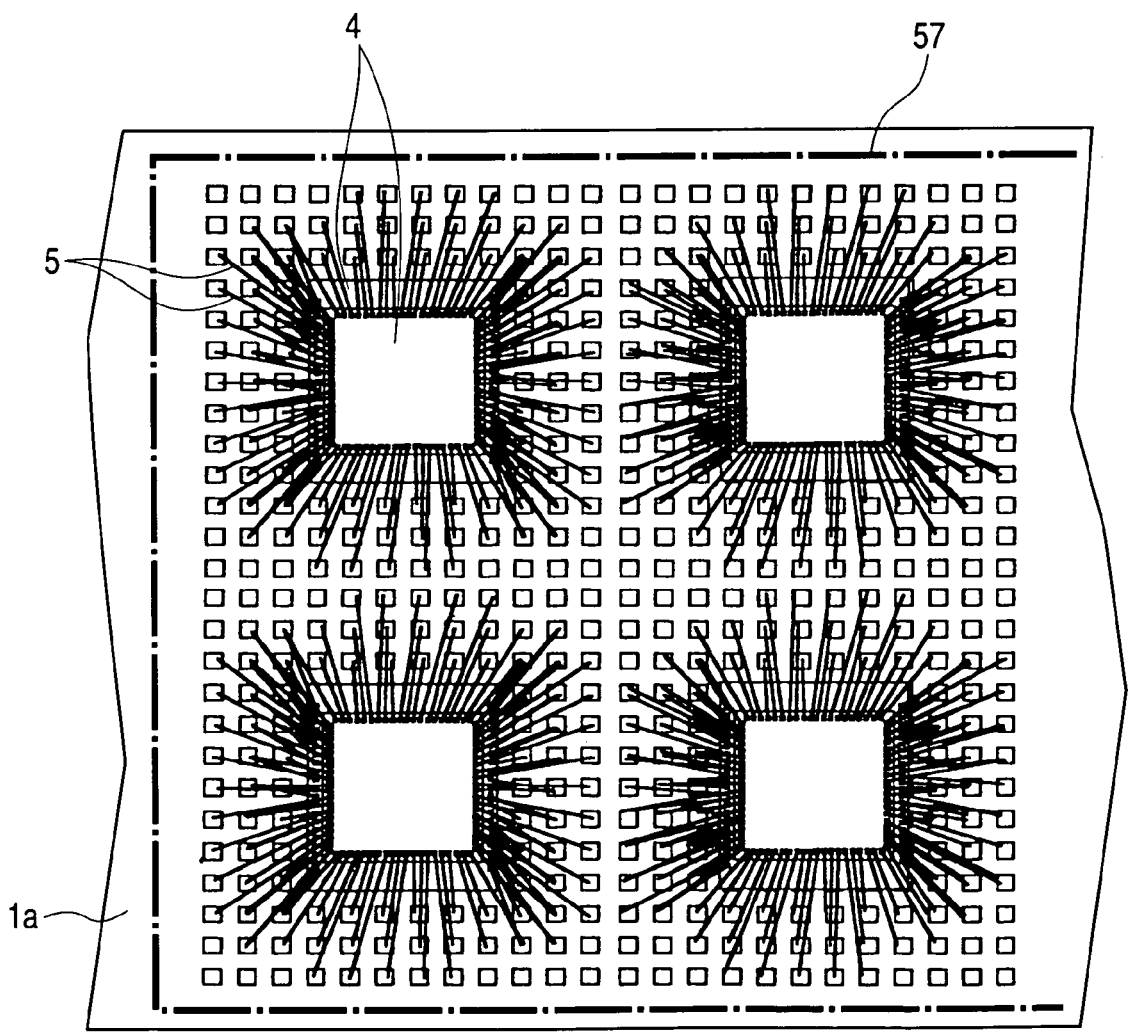
FIG. 48 is a schematic plan view of a terminals-arranged tape after chip bonding and wire bonding in a method of manufacturing the semiconductor device of the ninth embodiment.

In a method of manufacturing the semiconductor device according to this ninth embodiment there is used such a tape 1a as shown in FIG. 48. In FIG. 48, four product forming portions are formed longitudinally and transversely though not indicated by reference numerals. In each product forming portion, semiconductor elements 4 are fixed in two stacked stages at predetermined positions, and electrodes and terminals 2 on both upper and lower semiconductor elements are connected together through wires 5. In the same figure, reference numerals are affixed to only one product forming portion, and a partial region surrounded with a dot-dash line is a molding region 57 in transfer molding.

Figure 49:
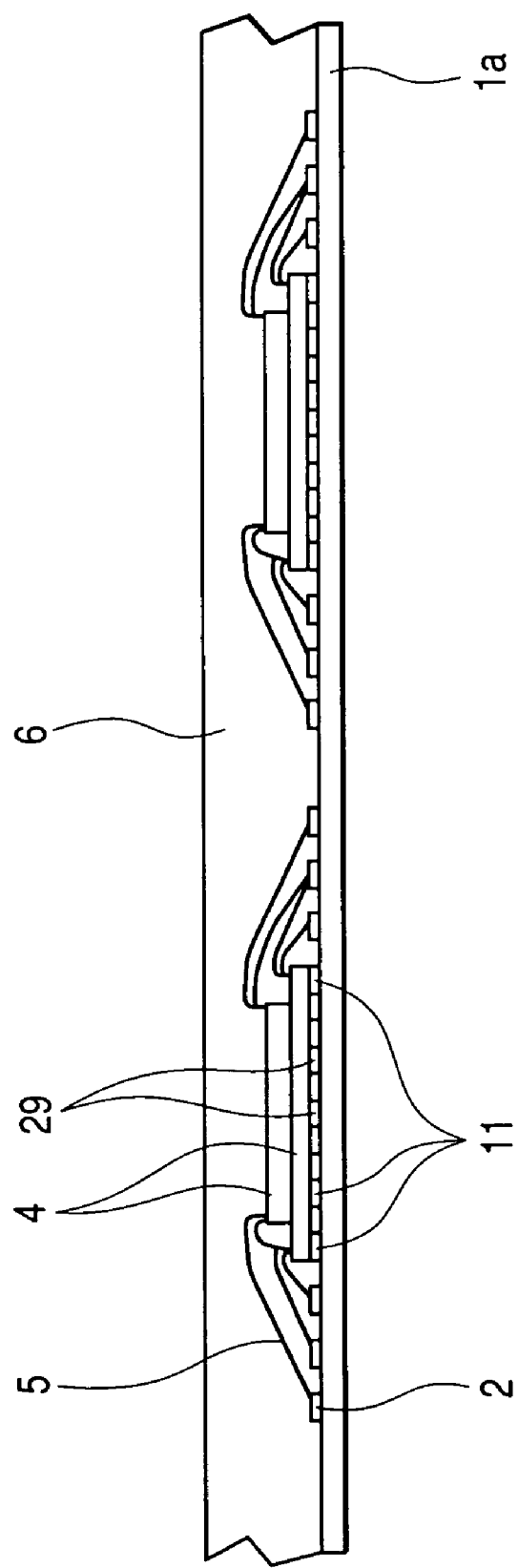
FIG. 49 is a schematic sectional view of the terminals-arranged tape with an insulating resin layer formed thereon in the method of manufacturing the semiconductor device of the ninth embodiment.

FIG. 49 is a schematic sectional view of the tape 1a as a terminals-arranged tape formed with an insulating resin layer 6 in the semiconductor device manufacturing method being considered. The semiconductor elements 4 stacked in two stages and the wires 5 are covered with the insulating resin layer 6.

In steps which follow this molding step, the tape 1a having thus been subjected to molding is peeled from the insulating resin layer 6 in the same way as in the previous embodiments and thereafter the insulating resin layer 6 is cut into a plurality of individual semiconductor devices 9.

FIGS. 50(a) and 50(b) are schematic sectional views of semiconductor devices manufactured by using other terminals-arranged tapes. In the semiconductor device 9 shown in FIG. 50(a), a semiconductor element 4 is mounted on a single semiconductor element fixing piece 11 and a semiconductor element 4 of a smaller size is fixed onto the underlying-semiconductor element 4 so as not to cover the electrodes formed on the underlying semiconductor element 4. In the semiconductor device 9 shown in FIG. 50(b), a semiconductor element 4 is fixed to a main surface of a tape 1a and a semiconductor element 4 of a smaller size is fixed onto the underlying semiconductor element 4 so as not to cover the electrodes formed on the underlying semiconductor element 4.

It goes without saying that such wiring distribution terminals as in the eighth embodiment may be arranged to facilitate a distributive connection of wires, though not shown. The wiring distribution terminals may be adopted in all of the previous embodiments.

Figure 51:
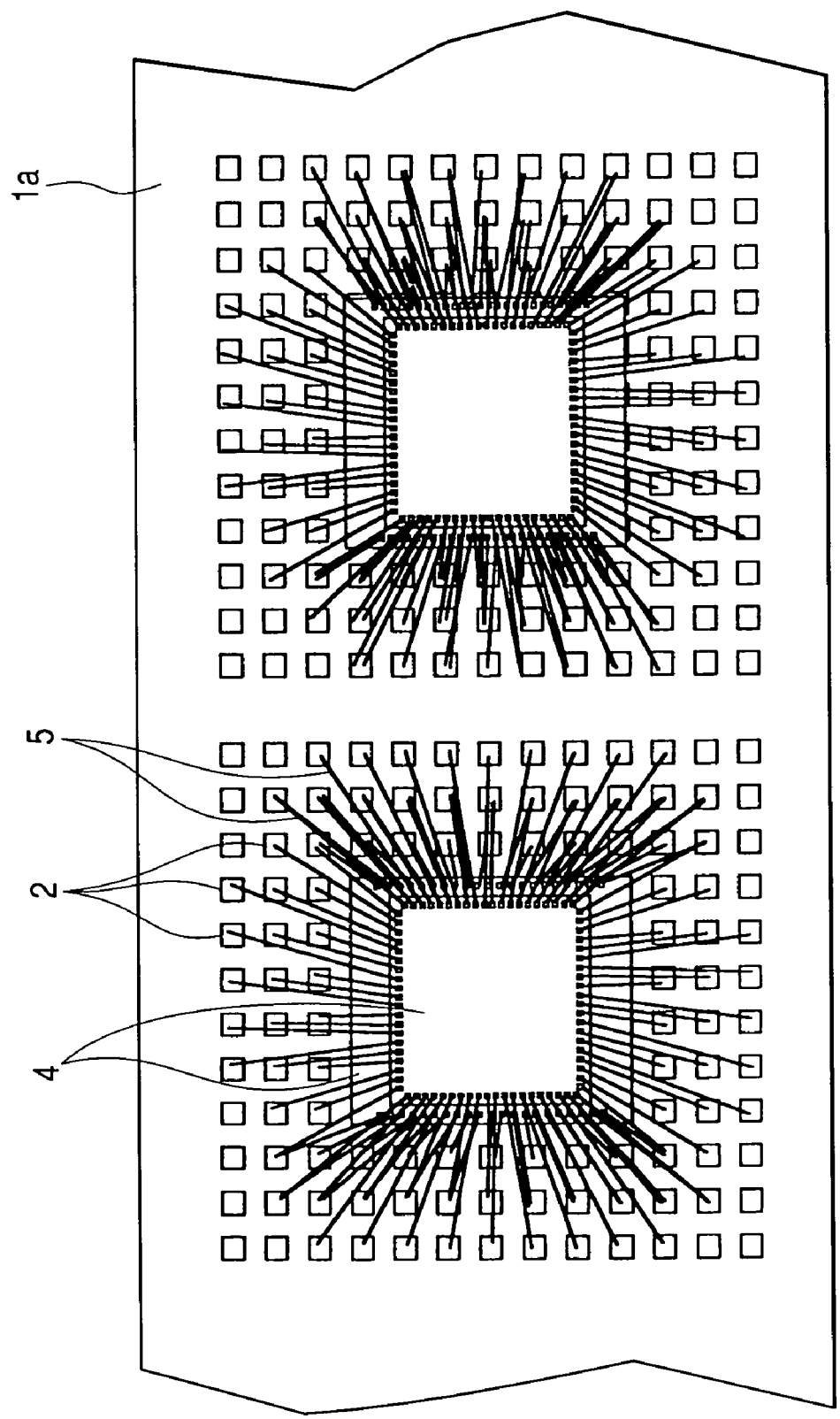
FIG. 51 is a schematic plan view showing an example of manufacturing semiconductor devices in a row on a terminals-arranged tape in the method of manufacturing the semiconductor device of the ninth embodiment.

Although in this embodiment reference has been made to the technique of manufacturing the semiconductor devices 9 with use of the tape 1a on which product forming portions are arranged in a matrix form, product forming portions may be arranged in one row to manufacture the semiconductor devices in one row on the tape 1a, as shown in FIG. 51.

According to this ninth embodiment, by stacking plural chips (semiconductor elements) in multiple stages within each semiconductor device 9, there can be manufactured a thin and small-sized semiconductor device 9 in a less expensive manner.

Although embodiments of the present invention have been described above concretely, it goes without saying that the invention is not limited to the above embodiments, but that various changes may be made within the scope not departing from the gist of the invention.

The following is a brief description of effects obtained by typical modes of the present invention as disclosed herein.
(1) It is possible to provide a thin, surface-mounted type semiconductor device.
(2) It is possible to provide a small-sized, surface-mounted type semiconductor device.
(3) It is possible to provide a thin, small-sized, less expensive, surface-mounted type semiconductor device.
(4) It is possible to provided a surface-mounted type semiconductor device high in packaging reliability.

In the semiconductor device manufacturing method according to the present invention, as set forth above, a terminals-arranged tape is provided, followed by fixing of chips and connection of wires, then the main surface of the tape, including the chips and the wires, is covered with an insulating resin, thereafter the tape is peeled, followed by cutting into individual semiconductor devices. This method is suitable for the manufacture of a non-leaded semiconductor device and it is possible to manufacture a thin and small-sized non-leaded semiconductor device.

What is claimed is:
1. A method of manufacturing a semiconductor device, comprising the steps of:
 (a) providing a tape having a main surface, a back surface opposed to the main surface, a product forming portion formed on the main surface, and a plurality of terminals formed in the product forming portion, said plurality of terminals arranged in a quadrangular frame having an equal number of rows and columns;
 (b) fixing a semiconductor element to the main surface of the tape;
 (c) electrically connecting a plurality of electrodes formed over the semiconductor element with the plurality of terminals through wires respectively;
 (d) sealing the semiconductor element, the wires, the plurality of terminals and the main surface of the tape with a resin, and forming a sealing member;
 (e) clamping, during said sealing step of (d), the tape between an upper die and a lower die, wherein the lower die includes a plurality of vacuum suction holes;

(f) after the step of (e), peeling the tape from the sealing member, and thereby exposing a part of each of the plurality of terminals from the sealing member; and
(g) forming a metal layer over the exposed part of each of the plurality of terminals,
wherein there is no exposure of the plurality of terminals and terminal leads at side edges of the sealing member; and
wherein the metal layer is formed by a printing process.

2. The method according to claim 1, wherein the plurality of terminals are formed by affixing a metal foil to the main surface of the tape and thereafter etching the metal foil selectively.

3. The method according to claim 2, wherein the metal foil is affixed to the main surface of the tape through a first adhesive.

4. The method according to claim 2, wherein the metal foil is compression-bonded to the tape by thermocompression bonding.

5. The method according to claim 1, wherein a back surface of the semiconductor element is exposed from the sealing member.

6. The method according to claim 1, wherein the tape has a semiconductor element fixing piece, and the semiconductor element is mounted over the semiconductor element fixing piece.

7. The method according to claim 1, wherein the plurality of terminals are fixed to the tape through a first adhesive, and the semiconductor element is fixed to the tape through a second adhesive.

8. The method according to claim 2, wherein a Pd plating film is formed over each of the plurality of terminals.

9. The method according to claim 1, wherein the tape is formed by a resin film selected from polyimide resin, ethylene-vinylacetate copolymer resin, polyolefin resin and methacrylate resin.

10. The method according to claim 1, wherein the steps (d) and (e) are carried out while the back surface of the tape is held by vacuum suction.

11. The method according to claim 1, wherein the number of rows and the number of columns is two.

12. A method of manufacturing a semiconductor device, comprising the steps of:
(a) providing a tape having a main surface, a back surface opposed to the main surface, a product forming portion formed on the main surface;
(b) forming a plurality of terminals in the product forming portion, said plurality of terminals arranged in a quadrangular frame having an equal number of rows and columns, by a screen printing method comprising
(b1) placing a mask on the main surface of the tape in contacting state;
(b2) applying a conductor paste onto the mask to print the plurality of terminals and a semiconductor fixing piece;
(b3) removing the mask; and
(b4) baking the printed conductor paste to form the plurality of terminals and the semiconductor fixing piece;
(c) fixing a semiconductor element to the semiconductor fixing piece on the main surface of the tape;
(d) electrically connecting a plurality of electrodes formed over the semiconductor element with the plurality of terminals through wires respectively;
(e) sealing the semiconductor element, the wires, the plurality of terminals and the main surface of the tape with a resin, and forming a sealing member;
(f) after the step of (e), peeling the tape from the sealing member, and thereby exposing a part of each of the plurality of terminals from the sealing member; and
(g) forming a metal layer over the exposed part of each of the plurality of terminals,
wherein there is no exposure of the plurality of terminals and terminal leads at side edges of the sealing member; and
wherein the metal layer is formed by a printing process.

13. The method according to claim 12, wherein a back surface of the semiconductor element is exposed from the sealing member.

14. The method according to claim 12, wherein the plurality of terminals are fixed to the tape through a first adhesive, and the semiconductor element is fixed to the tape through a second adhesive.

15. The method according to claim 12, wherein the tape is formed by a resin film selected from polyimide resin, ethylene-vinylacetate copolymer resin, polyolefin resin and methacrylate resin.

16. The method according to claim 12, wherein the step (e) is carried out while the back surface of the tape is held by vacuum suction.

17. The method according to claim 12, wherein the number of rows and the number of columns is two.

* * * * *